US010923526B2

(12) United States Patent
Lai et al.

(10) Patent No.: US 10,923,526 B2
(45) Date of Patent: Feb. 16, 2021

(54) MULTI-PASS IMAGING USING IMAGE SENSORS WITH VARIABLY BIASED CHANNEL-STOP CONTACTS FOR IDENTIFYING DEFECTS IN A SEMICONDUCTOR DIE

(71) Applicant: KLA-Tencor Corporation, Milpitas, CA (US)

(72) Inventors: Tzi-Cheng Lai, San Jose, CA (US); Jehn-Huar Chem, Morgan Hill, CA (US); Stephen Biellak, Sunnyvale, CA (US)

(73) Assignee: KLA Corporation, Milpitas, CA (US)

( * ) Notice: Subject to any disclaimer, the term of this patent is extended or adjusted under 35 U.S.C. 154(b) by 171 days.

(21) Appl. No.: 16/355,265

(22) Filed: Mar. 15, 2019

(65) Prior Publication Data
US 2019/0288028 A1    Sep. 19, 2019

Related U.S. Application Data

(60) Provisional application No. 62/643,502, filed on Mar. 15, 2018.

(51) Int. Cl.
*H01L 27/148* (2006.01)
*H01L 27/146* (2006.01)
(Continued)

(52) U.S. Cl.
CPC .......... *H01L 27/14806* (2013.01); *G06F 1/10* (2013.01); *H01L 27/1464* (2013.01);
(Continued)

(58) Field of Classification Search
CPC .......... H01L 27/1464; H01L 27/14806; H01L 27/14856; H01L 27/14887;
(Continued)

(56) References Cited

U.S. PATENT DOCUMENTS 6,259,085 B1    7/2001  Holland
6,456,318 B1 *  9/2002  Noguchi ............ G01N 21/9501
                                                       348/126
(Continued)

FOREIGN PATENT DOCUMENTS

JP    2006073736 A    3/2006
JP    2006100620 A    4/2006

OTHER PUBLICATIONS

A. Sopczak et al., "Modeling of Charge Transfer Inefficiency in a CCD with High-Speed Column Parallel Readout," IEEE 2008 Nuclear Science Symposium, Dresden, Germany (2008).
(Continued)

*Primary Examiner* — Que Tan Le
(74) *Attorney, Agent, or Firm* — Huse IP Law; Charles C. Huse

(57) ABSTRACT

First and second images of a semiconductor die or portion thereof are generated. Generating each image includes performing a respective instance of time-domain integration (TDI) along a plurality of pixel columns in an imaging sensor, while illuminating the imaging sensor with light scattered from the semiconductor die or portion thereof. The plurality of pixel columns comprises pairs of pixel columns in which the pixel columns are separated by respective channel stops. While performing a first instance of TDI to generate the first image, a first bias is applied to electrically conductive contacts of the channel stops. While performing a second instance of TDI to generate the second image, a second bias is applied to the electrically conductive contacts of the channel stops. Defects in the semiconductor die or portion thereof are identified using the first and second images.

18 Claims, 13 Drawing Sheets

(51) Int. Cl.
  *H04B 3/32* (2006.01)
  *H04N 5/357* (2011.01)
  *G06F 1/10* (2006.01)
  *H03L 7/081* (2006.01)
  *H04N 5/376* (2011.01)

(52) U.S. Cl.
  CPC .. *H01L 27/14605* (2013.01); *H01L 27/14609* (2013.01); *H03L 7/0814* (2013.01); *H04B 3/32* (2013.01); *H04N 5/357* (2013.01); *H04N 5/3765* (2013.01)

(58) Field of Classification Search
  CPC .... H01L 27/14812; H04B 3/32; H04N 5/357; H04N 5/3765
  USPC ............................................ 250/208.1, 559.4
  See application file for complete search history.

(56) References Cited

U.S. PATENT DOCUMENTS

| | | |
|---|---|---|
| 7,126,100 B1 | 10/2006 | Chuang et al. |
| 7,164,648 B1 | 1/2007 | Bachar et al. |
| 8,592,245 B2 | 11/2013 | Janesick |
| 8,767,098 B2 | 7/2014 | Solhusvik |
| 8,912,495 B2 | 12/2014 | Lange |
| 9,484,373 B1 | 11/2016 | Chen et al. |
| 2005/0255625 A1 | 11/2005 | Janesick et al. |
| 2007/0064135 A1 | 3/2007 | Brown |
| 2007/0131987 A1 | 6/2007 | Kim |
| 2010/0039923 A1 | 2/2010 | Kim et al. |
| 2014/0247380 A1 | 9/2014 | Hynecek |
| 2015/0177159 A1 | 6/2015 | Brown et al. |
| 2016/0097727 A1 | 4/2016 | Vazhaeparambil et al. |

OTHER PUBLICATIONS

Armin Karcher et al., "Measurement of Lateral Charge Diffusion in Thick, Fully Depleted, Back-Illuminated CCDs," IEEE Transactions on Nuclear Science, vol. 51, No. 5, pp. 2231-2237, Oct. 2004.
James R. Janesick et al., "High-Speed Scientific CCDs: Substrate Bounce," Proc. SPIE 4008, Optical and IR Telescope Instrumentation and Detectors, pp. 375-388, Aug. 16, 2000.
K. D. Stefanov, "CCD-based Sensor Development for the Vertex Detector at the ILC," 2007 IEEE Nuclear Science Symposium Conference Record pp. 1776-1779 (2007).
N. Miura et al., "A 1 Tb/s 3 W Inductive-Coupling Transceiver for 3D-Stacked Inter-Chip Clock and Data Link," IEEE J. of Solid-State Circuits, vol. 42, No. 1, pp. 111-22 (Jan. 2007).
N. Miura et al., "Crosstalk Countermeasures for High-Density Inductive-Coupling Channel Array," IEEE J. of Solid-State Circuits, vol. 42, No. 2, pp. 410-421 (Feb. 2007).
N. Miura et al., "Inductive Coupled Communications," Coupled Data Communication Techniques for High-Performance and Low-Power Computing p. 107 (Springer, R. Ho and R. Drost, eds., 2010).
PCT/US2018/055328, International Search Report, dated Feb. 1, 2019.
PCT/US2018/055328, Written Opinion of the International Searching Authority, dated Feb. 1, 2019.
Ricardo E. Schmidt, "On the Optimization of CCD Readout Noise," Optical Detectors for Astronomy (J.W. Beletic and P. Amico eds.), pp. 245-250, 1998, Kluwer Academic Publishers.
Stephen E. Holland et al., "Device Design for a 12.3 Megapixel, Fully Depleted, Back-Illuminated, High-Voltage Compatible Charge-Coupled Device," IEEE Transactions on Electron Devices, vol. 56, No. 11, pp. 2612-2622, Nov. 2009.
Stephen E. Holland et al., "Fully-Depleted, Back-Illuminated Charge-Coupled Devices Fabricated on High-Resistivity Silicon," IEEE Transactions on Electron Devices, vol. 50, No. 1, pp. 225-238, Jan. 2003.
Y. Chen et al., "A 0.7e RMS-Temporal-Readout—Noise CMOS Image Sensor for Low-Light-Level Imaging," 2012 IEEE International Solid-State Circuits Conference pp. 384-386 (2012).

* cited by examiner

300 ⟶

Provide an image sensor that includes a pixel array divided into a plurality of pixel groups. Each pixel group is clocked by a respective plurality of horizontal-register clocks. (302)

- Each pixel group is clocked by multiple reset clocks: each pixel group is divided into multiple clock domains and each reset clock clocks a respective clock domain. (304)

- Each pixel group is clocked by a respective plurality of vertical-register clocks. (306)

- The image sensor further includes digitizer circuitry and a plurality of taps. Each pixel group is coupled to the digitizer circuitry through one or more respective taps of the plurality of taps, to provide signals to the digitizer circuitry through the one or more respective taps. The digitizer circuitry includes multiple clock domains clocked by respective reference clocks and respective signal clocks. Each clock domain of the digitizer circuitry corresponds to a respective reset clock. (308)

↓

Adjust clock signals for the image sensor. (310)

- Phase-shift each plurality of horizontal-register clocks by a respective phase delay of a plurality of phase delays. The phase delays are evenly spaced and are spaced symmetrically about zero. (312)

↓

- For each pixel group, phase-shift the multiple reset clocks by distinct phase delays determined based on the respective phase delay for the plurality of horizontal-register clocks of the pixel group. (314)

↓

- Phase-shift each plurality of vertical-register clocks by a respective phase delay of a plurality of phase delays. The phase delays are evenly spaced and are spaced symmetrically about zero. (316)

↓

- For each clock domain of the digitizer circuitry, phase-shift the respective reference clock and the respective signal clock by phase delays determined based on the respective phase delay of the corresponding reset clock. (318)

↓

- Dynamically adjust the clocks. (320)

↓

With the clock signals adjusted in accordance with the adjusting, image a target using the image sensor. (322)

Figure 3A

MULTI-PASS IMAGING USING IMAGE SENSORS WITH VARIABLY BIASED CHANNEL-STOP CONTACTS FOR IDENTIFYING DEFECTS IN A SEMICONDUCTOR DIE

RELATED APPLICATION

This application claims priority to U.S. Provisional Patent Application No. 62/643,502, filed Mar. 15, 2018, titled "Low-Noise Back-Illuminated Image Sensor and Function Adjusting Method and System for Dark Field Defect Inspection," which is hereby incorporated by reference in its entirety for all purposes.

TECHNICAL FIELD

This disclosure relates to image sensors, and more specifically to image sensors in which the biasing of channel stops between pixels may be varied for successive imaging passes.

BACKGROUND

Various image sensors are suitable for sensing radiation at different wavelengths, such as visible, ultraviolet (UV), deep UV (DUV), vacuum UV (VUV), extreme UV (EUV), and X-ray wavelengths, and also for sensing electrons. One class of image sensors performs time-domain integration (TDI). TDI image sensors are particularly suitable for use in dark-field inspection systems including those used to inspect photomasks, reticles, and semiconductor wafers. To detect small defects or particles on photomasks, reticles, and semiconductor wafers, low-noise image sensors are required. Sources of image-sensor noise include dark current within the image sensor, readout noise in the image sensor, noise in the "off-chip" electronics that amplify and digitize the sensor output signals, and noise from external electronics including drivers and controllers that couples into the signal. To meet high throughput and sensitivity requirements in dark-field defect-inspection systems, high vertical line rates, a multi-tap architecture, and an off-chip digitizer may be used. Also, vertical clock phases may have high voltage swings. Such systems are particularly demanding regarding noise.

In addition to noise, harmonics, spurious products, and other sources of interference degrade the performance of imaging systems. Such interference distorts weak signals. To ensure the image quality, signal distortion should be avoided or reduced as much as possible. The noise floor of an image sensor may be reduced by reducing or removing interference (e.g., from spurious signals) through the use of multi-sampling. Multi-sampling, however, lowers the horizontal clock rate and thus reduces throughput.

The image sensor and digitizer (or digital-signal-processing (DSP) chip) are packaged (e.g., wired or flip-chip bonded into a package). The total subsystem noise performance depends not only on the image-sensor design itself but also on the package design and the design of the camera's printed circuit board (PCB) electronics. To enhance dark noise-floor performance, the minimization of electrical crosstalk in various light levels is also important. While multi-tap sensor architectures provide increased throughput, such architectures conventionally employ multiple synchronous (i.e., multi-sync) clock domains. (A clock domain refers to circuitry that operates according to transitions of a particular clock signal.) The image signal is susceptible to the electrical crosstalk or interference due to multi-sync clock domains (e.g., including domains for horizontal-register, reset, vertical-register, signal, and reference clocks), which can couple into power and ground planes in a complex manner.

In sensor systems with a multi-tap sensor architecture, the ground and power planes may be continuous to provide signal integrity at high frequency, or may be split to eliminate global crosstalk. Splitting ground and power planes may trade global noise disturbances for localized noise disturbances, if the plane splitting does not fully dampen high-frequency ground currents. Such localized noise disturbances will degrade low-light-level performance of an image sensor.

Systems with large (e.g., continuous) ground and power planes may encounter excited resonance behavior while running multi-sync clocks. In this situation, global crosstalk or interference often appears on dark (i.e., unilluminated) pixels while other pixels are illuminated. This type of global crosstalk or interference will degrade (i.e., increase) the dark noise floor of the dark pixels, which are affected by the illuminated pixels in the dark-field inspection system.

The calibration process for reducing crosstalk, as performed during manufacturing, is typically a cumbersome trial-and-error procedure that attempts to minimize crosstalk for a specific image sensor. Such a procedure may involve setting the reset clocking (i.e., the timing for clock signals that bias reset gates) to be periodic toward an edge of the image sensor, with reset clocks being spread out.

One challenge in designing back-illuminated image sensors is dealing with the weak alternating-current (AC) ground return in the photo-sensitive area (i.e., the pixel array). For example, a time-domain integration (TDI) charge-coupled device (CCD) image sensor may use multi-phased clock signals to clock the vertical registers of the pixel array. Lack of an adequate AC ground return can cause imbalances in the multi-phased clock signals to feed through to the readout amplifiers, which sense the feedthrough before it reaches ground. This feedthrough increases with vertical frequency (i.e., with line rate) and results in a direct-current (DC) offset (i.e., dark offset) for pixels that impairs system performance.

Another challenge is aliasing, which refers to artifacts introduced into an image through the sampling process. Aliasing causes the sampled image to differ from the target being imaged. For example, it may be desirable to maximize the amount of light on an image sensor, to increase the signal-to-noise ratio and to increase imaging speed and throughput (e.g., in the context of semiconductor inspection). However, magnifications that increase the amount of light on the image sensor may result in aliasing. Aliasing may be mitigated by degrading the modulation transfer function (MTF), which is a measure of the contrast at which different spatial frequencies are transferred to an image. The governing equation for MTF in an imaging process is:

$$MTF_{image}=MTF_{optical}*MTF_{diffusion}*MTF_{array}*MTF_{processing} \quad (1)$$

where $MTF_{optical}$ is the MTF of the imaging-system optics, $MTF_{diffusion}$ is the MTF of the sensor diffusion as defined by the charge from a single pixel that leaks into adjacent pixels, $MTF_{array}$ is the MTF created by the discrete nature of pixel sampling, and $MTF_{processing}$ is the MTF of image processing subsequent to image formation by the image sensor. Per equation 1, any of these factors can be degraded to degrade the overall $MTF_{image}$ and thus reduce or avoid aliasing. Techniques for MTF degradation, however, have significant side effects and may be impractical. $MTF_{optical}$ may be reduced by altering the imaging-system optics, but such alterations are often impractical because they discard light energy and thus reduce throughput, modify the light used to illuminate the image sensor in a manner that impedes imaging, and/or complicate the design of the optics. Algorithms for altering $MTF_{processing}$ are generally impractical because artifacts are typically indistinguishable from true image details. $MTF_{array}$ may be degraded by combining pixels, which tends to produce unacceptable results. $MTF_{diffusion}$ may be degraded by adjusting the amplitude of the clock signals that bias gates in the sensor array, which modifies the depletion depth of the active region. While effective, this technique reduces the pixel full-well capacity.

Yet another challenge is how to implement multi-spectral imaging. It may be desirable to use a single imaging system to performing imaging across a range of wavelengths (e.g., from ultraviolet to infrared). Typical photon-penetration depths vary strongly as a function of wavelength, however. The typical photon-penetration depth at 405 nm is approximately 0.1 to 0.2 um, at 650 nm is approximately 3 um, and at 900 nm is approximately 10 um. In the deeper portions of the ultraviolet (UV), for example between 190 nm and 300 nm, the photon-penetration depth is less than 0.01 um. This strong variation complicates the question of what substrate thickness to use for a multi-spectral imaging sensor. (The substrate of a back-illuminated image sensor is thinned to a specified thickness, in accordance with the wavelength or range of wavelengths to be used in the case of non-multi-spectral imaging.) When the substrate is too thin, it becomes semi-transparent at longer wavelengths (e.g., in the near infrared). It is desirable to increase the substrate thickness with increasing wavelength, to improve quantum efficiency (i.e., the rate at which photons produce electron/hole pairs). Increasing the substrate thickness, however, degrades the MTF at lower wavelengths by significantly increasing the depletion-free region in the substrate. This MTF degradation may result in poor imaging quality at shorter wavelengths when the substrate is thick enough to allow for imaging at longer wavelengths.

Techniques that provide enhanced AC ground return, $MTF_{diffusion}$ degradation to reduce or eliminate aliasing, and $MTF_{diffusion}$ enhancement to allow for multi-spectral imaging are described below and also disclosed in U.S. patent application Ser. No. 16/153,495, which is incorporated by reference herein in its entirety.

SUMMARY

In some embodiments, an imaging method includes generating a first image of a semiconductor die or portion thereof and generating a second image of the semiconductor die or portion thereof. Generating the first image includes performing a first instance of time-domain integration (TDI) along a plurality of pixel columns in an imaging sensor, while illuminating the imaging sensor with light scattered from the semiconductor die or portion thereof. The plurality of pixel columns comprises pairs of pixel columns in which the pixel columns are separated by respective channel stops. The channel stops comprise respective localized oxidation of silicon (LOCOS) structures, respective regions of doped silicon beneath the respective LOCOS structures, and electrically conductive contacts that extend through the LOCOS structures and form ohmic contacts with the regions of doped silicon. While performing the first instance of TDI, a first bias is applied to the electrically conductive contacts. Generating the second image includes performing a second instance of TDI along the plurality of pixel columns in the imaging sensor, while illuminating the imaging sensor with light scattered from the semiconductor die or portion thereof. While performing the second instance of TDI, a second bias is applied to the electrically conductive contacts. The method also includes identifying defects in the semiconductor die or portion thereof using the first and second images.

In some embodiments, a semiconductor-inspection system includes an inspection tool with an image sensor. The image sensor includes pairs of pixel columns in which the pixel columns are separated by respective channel stops. The channel stops include respective LOCOS structures, respective regions of doped silicon beneath the respective LOCOS structures, and electrically conductive contacts that extend through the LOCOS structures and form ohmic contacts with the regions of doped silicon. The semiconductor-inspection system also includes one or more processors and memory storing one or more programs for execution by the one or more processors. The one or more programs including instructions for performing the above method.

In some embodiments, a non-transitory computer-readable storage medium stores one or more programs for execution by one or more processors of a computer system that is communicatively coupled with an inspection tool that includes an image sensor. The image sensor includes pairs of pixel columns in which the pixel columns are separated by respective channel stops. The channel stops include respective LOCOS structures, respective regions of doped silicon beneath the respective LOCOS structures, and electrically conductive contacts that extend through the LOCOS structures and form ohmic contacts with the regions of doped silicon. The one or more programs including instructions for performing the above method.

BRIEF DESCRIPTION OF THE DRAWINGS

For a better understanding of the various described implementations, reference should be made to the Detailed Description below, in conjunction with the following drawings.

FIG. 3A is a flowchart showing a method of operating an image sensor in accordance with some embodiments.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1A:
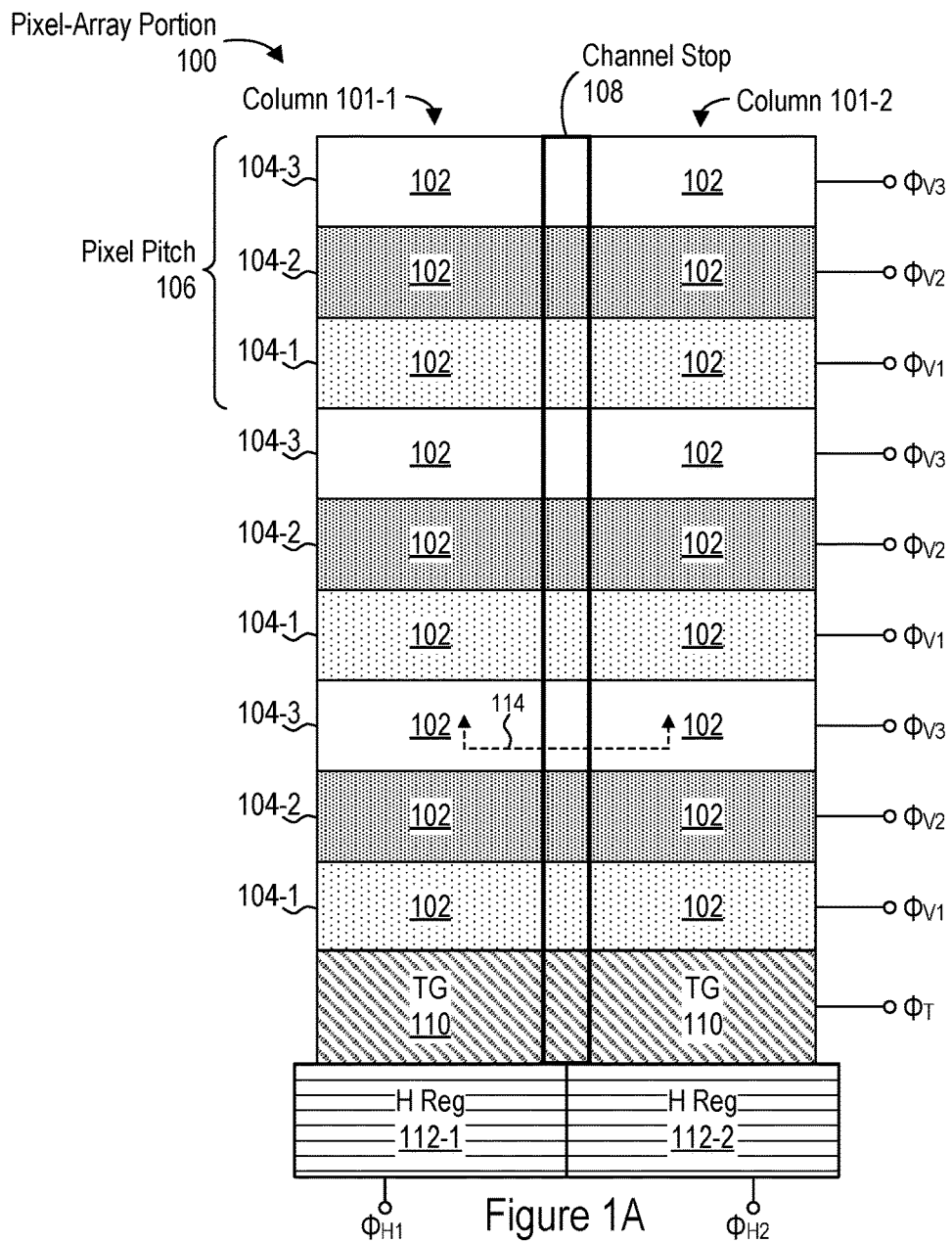
FIG. 1A is a plan view of a portion of a pixel array in an image sensor in accordance with some embodiments.

FIG. 1A is a plan view of a portion 100 of a pixel array in an image sensor in accordance with some embodiments. The portion 100 includes a pair of pixel columns 101-1 and 101-2 and an intervening channel stop 108. The full pixel array includes a repeating sequence of pairs of pixel columns 101 with respective intervening channel stops 108 between the pixel columns 101 of each pair. Each pair of pixel columns 101 may be separated from the next pair of pixel columns 101 by another channel stop 108 or by an anti-blooming structure (e.g., an anti-blooming drain surrounded by a pair of anti-blooming gates, all extending in the direction of the pixel columns 101).

Figure 1B:
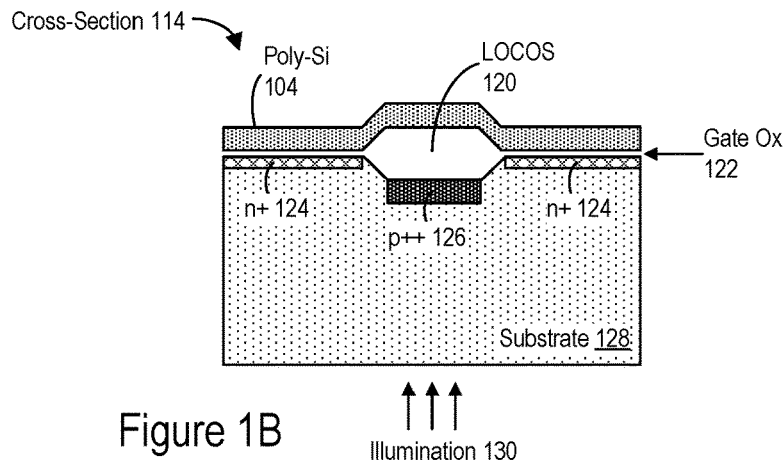
FIG. 1B shows a cross-section of two gates and an intervening channel stop in the pixel-array portion of FIG. 1A in accordance with some embodiments.

Each pixel column 101 includes a vertical series of gates 102, which act as vertical registers. The channel stop 108 stops charge from leaking to horizontally adjacent gates 102 (i.e., from a gate 102 in the first column 101-1 to an adjacent gate 102 in the second column 101-2, and vice-versa). The gates 102 are fabricated using stripes 104 of electrically conductive polysilicon ("poly-Si" or simply "poly") that extend across the columns 101 and intervening channel stops 108. (Gate fabrication is discussed further below with respect to FIG. 1B). Each polysilicon stripe 104 is electrically isolated from adjacent polysilicon stripes 104 (e.g., each polysilicon stripe 104-2 is electrically isolated from adjacent polysilicon stripes 104-1 and 104-3, and likewise for each polysilicon stripe 104-1 and 104-3). Each polysilicon stripe 104 is biased using a vertical-register clock signal $\Phi_V$ from a vertical-register clock. In the example of FIG. 1, each polysilicon stripe 104-1 is biased by a first vertical-register clock signal $\Phi_{V1}$ from a first vertical-register clock, each polysilicon stripe 104-2 is biased by a second vertical-register clock signal $\Phi_{V2}$ from a second vertical-register clock, and each polysilicon stripe 104-3 is biased by a third vertical-register clock signal $\Phi_{V3}$ from a third vertical-register clock. The vertical-register clock signals $\Phi_{V1}$, $\Phi_{V2}$, and $\Phi_{V3}$ applied to successive polysilicon stripes 104 have respective phases that are offset from each other (e.g., by 120°. When the pixel array is illuminated, charge accumulates under respective gates 102, in accordance with the biasing. The phase offsets of the vertical-register clock signals $\Phi_{V1}$, $\Phi_{V2}$, and $\Phi_{V3}$ result in accumulated charge being transferred from gate 102 to gate 102 along each pixel column 101 until the charge reaches a transfer gate 110 at the end of the pixel column 101. The transfer gate 110, which is biased by a transfer clock signal $\Phi_T$, transfers the charge from the last gate 102 in a column to a respective horizontal register 112. Charge is then transferred horizontally between successive horizontal registers 112 to a digitizer (e.g., digitizer circuitry 214, FIG. 2), which senses the charge. Each horizontal register is biased using a horizontal register clock signal $\Phi_H$ from a horizontal-register clock. In the example of FIG. 1, a first horizontal register 112-1 is biased by a first horizontal-register clock signal $\Phi_{H1}$ from a first horizontal-register clock and a second horizontal register 112-2 is biased by a second horizontal-register clock signal $\Phi_{H2}$ from a second horizontal-register clock. The horizontal-register clock signals $\Phi_{H1}$ and $\Phi_{H2}$ (and any additional horizontal-register clock signals biasing subsequent horizontal registers) have respective phases that are offset from each other to cause charge to be horizontally transferred between successive horizontal registers 112.

A sequence of gates 102 that receive the full set of vertical-register clock signals $\Phi_{V1}$, $\Phi_{V2}$, and $\Phi_{V3}$ in a pixel column 101 is defined as a pixel, with a vertical pixel pitch 106. In the example of FIG. 1, there are three vertical-register clock signals $\Phi_{V1}$, $\Phi_{V2}$, and $\Phi_{V3}$, and a pixel therefore includes three successive gates 102. In other examples, there may be only two vertical-register clock signals or four or more vertical-register clock signals with respective phases (e.g., offset by a number of degrees equal to 360° divided by the number of clock signals), and the number of successive gates 102 in a pixel equals the number of clock signals and thus the number of respective phases. The vertical-register clock signals may be sinusoidal (as may the horizontal-register clock signals and other clock signals discussed below).

FIG. 1B shows a cross-section 114 of two gates 102 and an intervening channel stop 108 in accordance with some embodiments. Each gate 102 includes a gate oxide 122 situated beneath a polysilicon stripe 104 and above a region 124 doped n-type (e.g., n+). The channel stop 108 includes LOCOS (i.e., a LOCOS structure formed through localized oxidation of silicon) 120 and a region 126 beneath the LOCOS 120 that is doped p-type. For example, the dopant concentration of the region 126 may be p++ (e.g., greater than 1e18 cm-3) or p+ (e.g., between 1e17 cm-3 and 1e18 cm-3). The regions 124 and 126 and the LOCOS 120 are formed on a substrate 128, which may be an epitaxial silicon layer (an "epi-layer") grown on bulk silicon, with the bulk silicon subsequently being polished off to allow for back-side illumination 130. The substrate 128 may be p-type (e.g., near-intrinsic p-type). The dopant concentration of the region 126 is thus significantly higher (e.g., by several orders of magnitude) than the dopant concentration of the substrate 128. While the region 124 is described as n-type and the region 126 and substrate 128 are described as p-type, these dopant types may be reversed.

Figure 2:
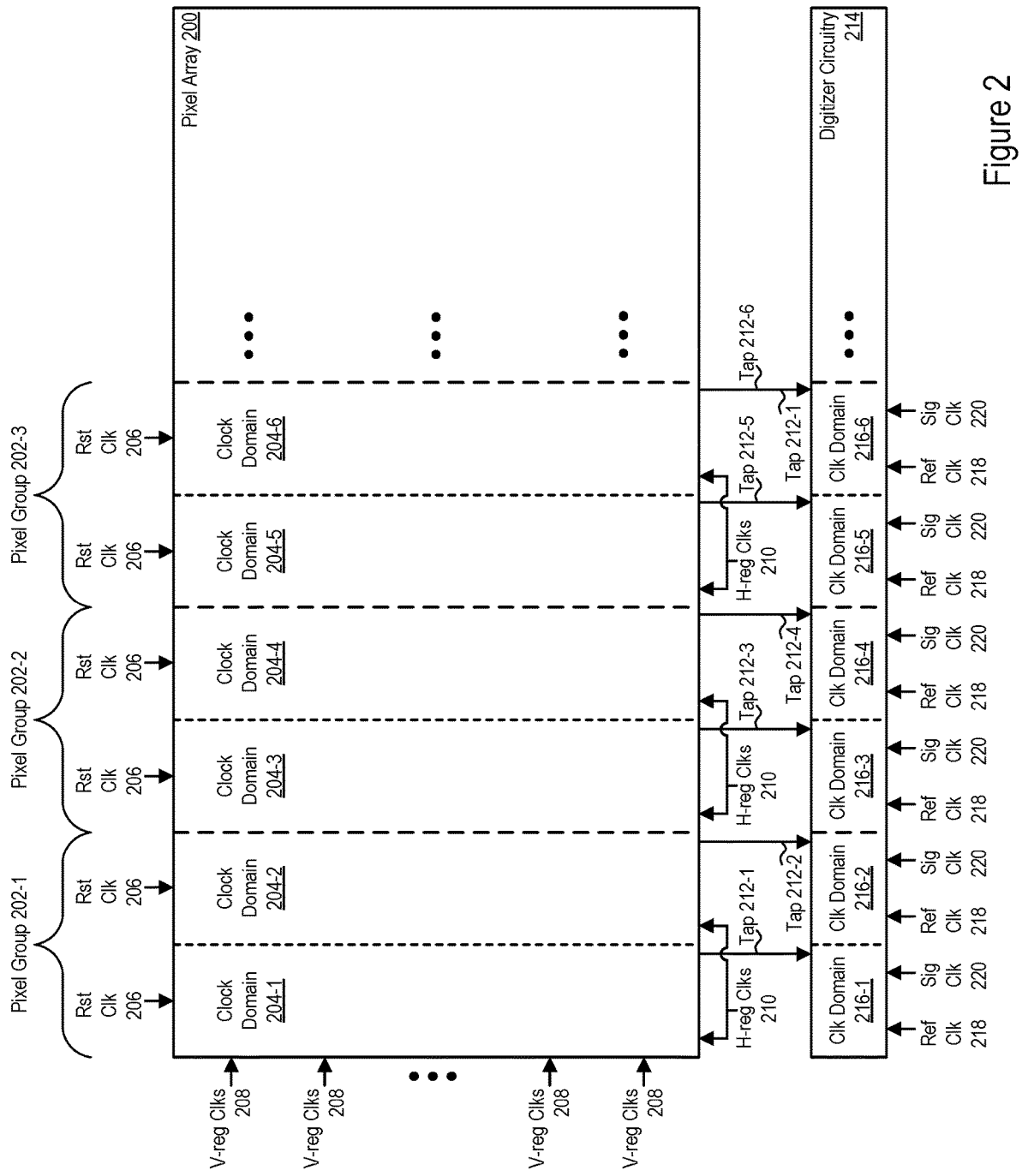
FIG. 2 shows a multi-tap architecture for an image sensor in accordance with some embodiments.

FIG. 2 shows a multi-tap architecture for an image sensor in accordance with some embodiments. A pixel array 200 in an image sensor is coupled to digitizer circuitry 214 through a plurality of taps 212. The pixel array 200 is divided into pixel groups 202 (e.g., pixels groups 202-1, 202-2, 202-3, etc.). Each pixel group 202 comprises a plurality of successive pairs of pixel columns 101-1 and 101-2. Each pixel group 202 is clocked by a distinct plurality of horizontal-register clocks 210 (e.g., by a distinct set of horizontal-register clock signals $\Phi_{H1}$, $\Phi_{H2}$, etc.), which bias the horizontal registers 112 in the pixel group 202.

Active pixels in the pixel array 200 are clocked by vertical-register clocks 208, such that the gates 102 are biased by respective vertical-register clock signals (e.g., $\Phi_{V1}$, $\Phi_{V2}$, and $\Phi_{V3}$, FIG. 1A). In some embodiments, each pixel group 202 is clocked by a distinct plurality of vertical-register clocks 208, which bias the gates 102 in the pixel group 202.

Each pixel group 202 is divided into multiple clock domains 204. For example, each pixel group 202 may be divided into two clock domains 204: a first pixel group 202-1 is divided into two clock domains 204-1 and 204-2, a second pixel group 202-2 is divided into two clock domains 204-3 and 204-4, and so on. In other examples, each pixel group 202 may be divided into a different even number of clock domains 204 (e.g., into four clock domains 204). Each clock domain 204 is clocked by a distinct reset clock 206 (i.e., receives a distinct reset clock signal), which resets the pixels of the clock domain 204 by draining charge from the pixels and thus resetting the pixels to a reference level. The number of reset clocks 206 per pixel group 202 therefore equals the number of clock domains 204 per pixel group 202. All of the clock domains 204 for a given pixel group 202 are clocked by the same plurality of horizontal-register clocks 210, however (and, in some embodiments, by the same plurality of vertical-register clocks 208). For example, the clock domains 204-1 and 204-2 are both clocked by a first plurality of horizontal-register clocks 210, the clock domains 204-3 and 204-4 are both clocked by a second plurality of horizontal-register clocks 210, and the clock domains 204-5 and 204-6 are both clocked by a third plurality of horizontal-register clocks 210.

In some embodiments, each clock domain 204 is coupled to the digitizer circuitry 214 through a respective tap 212: clock domain 204-1 is coupled to the digitizer circuitry 214 through a first tap 212-1, clock domain 204-2 is coupled to the digitizer circuitry 214 through a second tap 212-2, and so on. Within a clock domain 204, charge transferred from the gates 102 to the horizontal registers 112 is then transferred horizontally between successive horizontal registers 112 until reaching a respective tap 212, which transfers the charge to the digitizer circuitry 214, which creates digital signals corresponding to respective amounts of charge for respective pixels. The digital signals are indicative of pixel values. The digitizer circuitry 214 may be divided into a plurality of clock domains 216 (e.g., including clock domains 216-1 through 216-6), each of which corresponds to a respective clock domain 204 (e.g., to respective clock domains 204-1 through 204-6). Each clock domain 216 may perform correlated double sampling of analog signals (i.e., corresponding to respective amounts of charge) received from the respective clock domain 204 of the pixel array 200. To perform correlated double sampling, each clock domain 216 uses clock signals from a distinct reference clock 218 and signal clock 220.

FIG. 3A is a flowchart showing a method 300 of operating an image sensor in accordance with some embodiments. The method 300 is described with reference to FIG. 4, which shows an example of the clock adjustment performed in the method 300. (The varying sizes of the arrows in FIG. 4 are merely for visual distinction.) In the method 300, an image sensor (e.g., a back-illuminated image sensor) is provided (302) that includes a pixel array (e.g., pixel array 200, FIG. 2) divided into a plurality of pixel groups (e.g., pixel groups 202, FIG. 2). Each pixel group is clocked by a respective plurality of horizontal-register clocks (e.g., horizontal-register clocks 210, FIG. 2). In some embodiments, each pixel group is also clocked (304) by multiple reset clocks (e.g., reset clocks 206, FIG. 2): each pixel group is divided into multiple clock domains (e.g., clock domains 204, FIG. 2) and each reset clock clocks a respective clock domain. In some embodiments, each pixel group is clocked (306) by a respective plurality of vertical-register clocks (e.g., a plurality of vertical-register clocks 208, FIG. 2). In some embodiments, the image sensor further includes digitizer circuitry (e.g., digitizer circuitry 214, FIG. 2) and a plurality of taps (e.g., taps 212, FIG. 2). Each pixel group is coupled (308) to the digitizer circuitry through one or more respective taps of the plurality of taps, to provide signals to the digitizer circuitry through the one or more respective taps. The digitizer circuitry includes multiple clock domains (e.g., clock domains 216, FIG. 2) clocked by respective reference clocks (e.g., reference clocks 218, FIG. 2) and respective signal clocks (e.g., signal clocks 220, FIG. 2). Each clock domain of the digitizer circuitry corresponds to a respective reset clock.

Clock signals for the image sensor are adjusted (310). Each plurality of horizontal-register clocks is phase-shifted (312) by a respective phase delay of a plurality of phase delays. The phase delays are evenly spaced and are spaced symmetrically about zero. For example, the phase delays for four pluralities of horizontal-register clocks 210-1 through 210-4 are evenly spaced and are symmetrical about zero, as shown in FIG. 4. In some embodiments, the plurality of phase delays includes a phase delay of zero and a plurality of distinct non-zero phase delays. Each plurality of horizontal-register clocks that is phase-shifted by a non-zero phase delay is phase-shifted by a distinct non-zero phase delay (e.g., the pluralities of horizontal-register clocks 210-1 and 210-4, FIG. 4, are phase shifted by ±x %*T). Multiple (e.g., two) pluralities of horizontal-register clocks may share the phase delay of zero (e.g., as shown in FIG. 4 for the pluralities of horizontal-register clocks 210-2 and 210-3, which both have phase delays of 0 ns and therefore are shown as overlapping).

In some embodiments, different groups of horizontal-register clocks are situated on different split power and ground planes. For example, first and second pluralities of horizontal-register clocks 210-1 and 210-2 are situated on a first split power/ground plane, while third and fourth pluralities of horizontal-register clocks 210-3 and 210-4 are situated on a second split power/ground plane. In the phase-shifting of step 312, phase delays may be assigned such that the pluralities of horizontal-register clocks 210 for each split plane have successive phase delays, so that no horizontal-register clock 210 for a given split plane is situated between horizontal-register clocks 210 for another split plane on the phase-delay timeline.

In some embodiments, for each pixel group, the multiple reset clocks are phase-shifted (314) by distinct phase delays determined based on the respective phase delay for the plurality of horizontal-register clocks of the pixel group. For example, as shown in FIG. 4, reset clocks 206-1 and 206-2 are phase-shifted by phase delays determined based on the phase delay of the first plurality of horizontal-register clocks 210-1. Likewise, reset clocks 206-3 and 206-4 are phase-shifted by phase delays determined based on the phase delay of the second plurality of horizontal-register clocks 210-2, reset clocks 206-5 and 206-6 are phase-shifted by phase delays determined based on the phase delay of the third plurality of horizontal-register clocks 210-3, and reset clocks 206-7 and 206-8 are phase-shifted by phase delays determined based on the phase delay of the fourth plurality of horizontal-register clocks 210-4. In some embodiments, the distinct phase delays for the multiple reset clocks may be determined by shifting the respective phase delay for the plurality of horizontal-register clocks by specified percentages. The specified percentages may be the same for the multiple reset clocks of multiple pixel groups of the plurality of pixel groups. The distinct phase delays for the multiple reset clocks may be spaced symmetrically about the respective phase delay for the plurality of horizontal-register clocks for a particular pixel group.

In some embodiments for which step 306 applies, each plurality of vertical-register clocks is phase-shifted (316) by a respective phase delay of a plurality of phase delays. Step 316 may be performed in a similar manner as step 312. For example, the phase delays may be evenly spaced and spaced symmetrically about zero. In some embodiments, the plurality of phase delays includes a phase delay of zero and a plurality of distinct non-zero phase delays. Each plurality of vertical-register clocks that is phase-shifted by a non-zero phase delay is phase-shifted by a distinct non-zero phase delay (e.g., by ±y %*T). These non-zero phase delays may be distinct from the non-zero phase delays for the horizontal-register clocks. Multiple (e.g., two) pluralities of vertical-register clocks may share the phase delay of zero.

In some embodiments, for each clock domain of the digitizer circuitry, the respective reference clock and the respective signal clock are phase-shifted (318) by phase delays determined based on the respective phase delay of the corresponding reset clock. For example, as shown in FIG. 4, each reference clock 218-1 through 218-8 is phase-shifted by a phase-delay determined based on the phase delay of each corresponding reset clock 206-1 through 206-8. Likewise, each signal clock 220-1 through 220-8 is phase-shifted by a phase-delay determined based on the phase delay of each corresponding reset clock 206-1 through 206-8. The phase delays for the reference clocks 218-1 through 218-8 may each be distinct from the phase delays for the corresponding signal clocks 220-1 through 220-8.

In some embodiments, the phase delay for the respective reference clock is determined by shifting the respective phase delay of the corresponding reset clock by a first specified percentage, and the phase delay for the respective signal clock is determined by shifting the respective phase delay of the corresponding reset clock by a second specified percentage distinct from the first specified percentage. The first specified percentage may be the same for every clock domain of the digitizer circuitry, as may the second specified percentage.

In some embodiments, once the phase-shifting of steps 312, 314, 316, and/or 318 has been performed, one or more clocks (e.g., the reset clocks, reference clocks, and/or signal clocks) are dynamically adjusted (320), such that the phase delays of respective clocks are changed with respect to the phase delays set in steps 312, 314, 316, and/or 318. For example, different portions of the pixel array are successively illuminated. While a given portion of the pixel array is illuminated, the remainder of the pixel array is dark. Noise for the pixel array is measured with the different portions illuminated, and some or all of the clocks are dynamically adjusted to reduce the measured noise. This dynamic adjustment allows the noise floor to be further reduced (e.g., minimized) on a system-by-system basis.

With the clock signals adjusted in accordance with the adjusting, a target is imaged (322) using the image sensor. In some embodiments, the target is a semiconductor wafer. In some embodiments, dark-field defect inspection is performed on the target.

In some embodiments, the timing for the adjusted clock signals is stored (e.g., in a timing file 522, FIG. 5) once the adjustments are complete. Before the target is imaged in step 322, the stored timing is loaded (e.g., from the timing file 522, FIG. 5), and the target is imaged using the loaded timing.

The order of operations in the method 300 may vary for operations that are not order-dependent. For example, the order of step 316 may vary with respect to steps 312, 314, and/or 318.

Figure 3B:
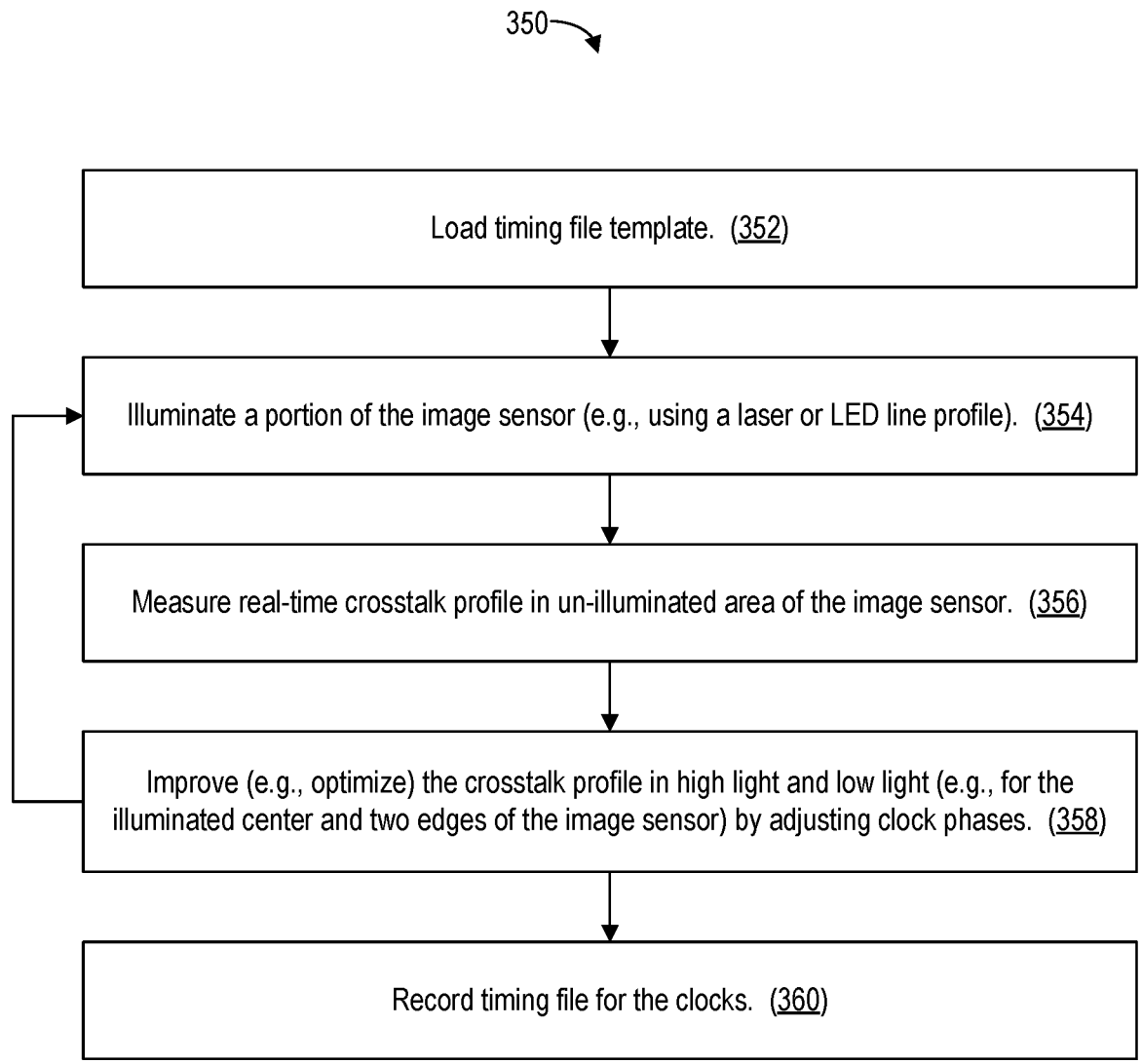
FIG. 3B is a flowchart showing a method of performing dynamic adjustment of clock signals and storing timing for the adjusted clock signals, in accordance with some embodiments.
Figure 4:
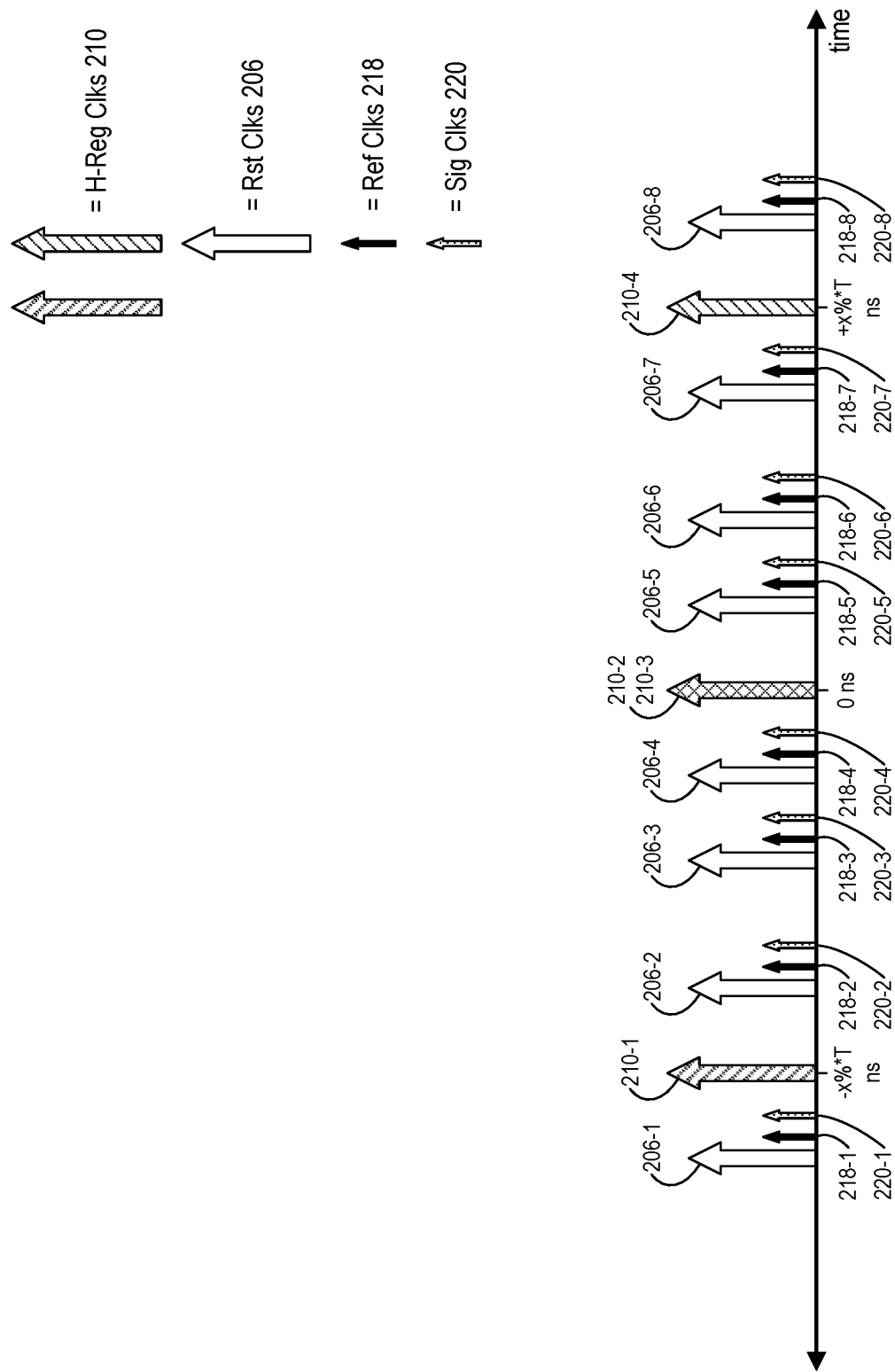
FIG. 4 shows examples of phase delays for various clock signals, resulting from clock adjustment as performed in the method of FIG. 3A.

FIG. 3B is a flowchart of a method 350 of performing the dynamic adjustment of step 320 (FIG. 3A) and storing the timing for the adjusted clock signals, in accordance with some embodiments. In the method 350, a timing file template is loaded (352). A portion of the image sensor (e.g., of the pixel array 200, FIG. 2) is illuminated (354), for example using a laser or LED line profile. The real-time crosstalk profile in an unilluminated area of the image sensor is measured (356), and clock phases are adjusted (358) to improve (e.g., optimize) the crosstalk profile in high light and low light (e.g., for the illuminated center and two edges of the image sensor). The measured cross-talk profile may be displayed in a graphical user interface (e.g., on a display 511, FIG. 5). Multiple iterations of steps 354, 356, and 358 are performed with different portions of the image sensor being illuminated. A timing file is recorded (360) that specifies the adjusted timing for the clock signals. The timing file is created using the timing file template.

The method 300 may result in a total crosstalk signal $V^j c(t)$ per pixel within a digitizer domain (e.g., a clock domain 216, FIG. 2) in an unilluminated portion of a pixel array, as given in the following equation (1), in accordance with FIG. 4:

$$V^j{}_C(t) = \qquad (1)$$

$$V_0 \Bigg( v = \Bigg\{ a^i 1 \sum_{i=1}^{n_A} U_{H_A}(t) + a^i 2 \sum_{i=1}^{n_B} U_{H_B}(t) + a^i 3 \sum_{i=1}^{n_C} U_{H_C}(t + x\, \%*T) +$$

$$a^i 4 \sum_{i=1}^{n_D} U_{H_D}(t - x\, \%*T) + a^i 5 \sum_{i=1}^{n_{R_{A1}}} U_{R_{A1}}(t + \Delta_{A1(i)}) +$$

$$a^i 6 \sum_{i=1}^{n_{R_{A2}}} U_{R_{A2}}(t + \Delta_{A2(i)}) + a^i 7 \sum_{i=1}^{n_{R_{B1}}} U_{R_{B1}}(t + \Delta_{B1(i)}) + a^i 8$$

$$\sum_{i=1}^{n_{R_{B2}}} U_{R_{B2}}(t - \Delta_{B2(i)}) + a^i 9 \sum_{i=1}^{n_{R_{C1}}} U_{R_{C1}}(t + \Delta_{C1(i)} + x\, \%*T) +$$

$$a^i 10 \sum_{i=1}^{n_{R_{C2}}} U_{R_{C2}}(t - \Delta_{C2(i)} + x\, \%*T) +$$

$$a^i 11 \sum_{i=1}^{n_{R_{D1}}} U_{R_{D1}}(t + \Delta_{D1(i)} - x\, \%*T) +$$

-continued $$a^i 12 \sum_{i=1}^{n_{R_{D2}}} U_{R_{D2}}(t - \Delta_{D2(i)}) - x \% * T) +$$

$$a^i 13 \sum_{i=1}^{N_R} \delta_{SIG}(t - t_i) + a^i 14 \sum_{i=1}^{N_R} \delta_{REF}(t - t_i) \Bigg) \Bigg)$$

where $N_R$ is the total number of signal clocks 220 or reference clocks 218 in the digitizer circuitry 214 and also $N_R = n_{R_{A1}} + n_{R_{A2}} + n_{R_{B1}} + n_{R_{B2}} + n_{R_{C1}} + n_{R_{C2}} + n_{R_{D1}} + n_{R_{D2}}$ is the total number of reset clocks 206, $a^i 1 \ldots a^i 14$ are coupling coefficients, $U_{H_{y=A,B,C,D}}(t)$ are horizontal-register clock signals for respective pixel groups 202 indexed by y, $N_H = n_A + n_B + n_C + n_D$ is the total number of horizontal-register clocks for the image sensor, T is the period for the horizontal-register clock signals, ±x %*T are phase delays for respective horizontal-register clock signals, $U_{R[y=A,B,C,D][n=1,2]}(t)$ are reset clock signals for respective clock domains 204 indexed by y and n, $\Delta_{[y=A,B,C,D][n=1,2]}$ are reset-clock phase delays, $\delta_{REF}(t)$ is the impulse response for a reference clock 218, and $\delta_{SIG}(t)$ is the impulse response for a signal clock 220.

For the purpose of dealing with crosstalk or interference, the coupling coefficients per pixel need not be determined. Instead, the procedure to minimize crosstalk or interference may be represented in the following mathematical form:

$$\mathcal{L}\{V^2 c(t)\} = \text{minimum} \quad (2)$$

where $\mathcal{L}$ is the operator acting on the functional series in equation 1 to minimize the crosstalk or interference value. The following timing constraints are applied for each time sub-domain:

Time Range of $|U_{R[y=A,B,C,D]1}(t+\delta_{y1(i)}+x\%*T)| \leq t_{y1}$,
where $i=1: n_{R_{y1}}$ (3)

Time Range of $|U_{R[y=A,B,C,D]2}(t+\delta_{y2(i)}+x\%*T)| \leq t_{y2}$,
where $i=1: n_{R_{y2}}$ (4)

Time Range of $|\delta_{SIG}(t-t_i)| \leq t_{y3}$, where $i=1: N_R$ (5)

Time Range of $|\delta_{REF}(t-t_i)| \leq t_{y4}$, where $i=1: N_R$ (6)

Accordingly, crosstalk or interference can be evenly spread in the time domain in small groups. This procedure can be implemented either by using software automation, making manual adjustments, or a combination of both.

Figure 5:
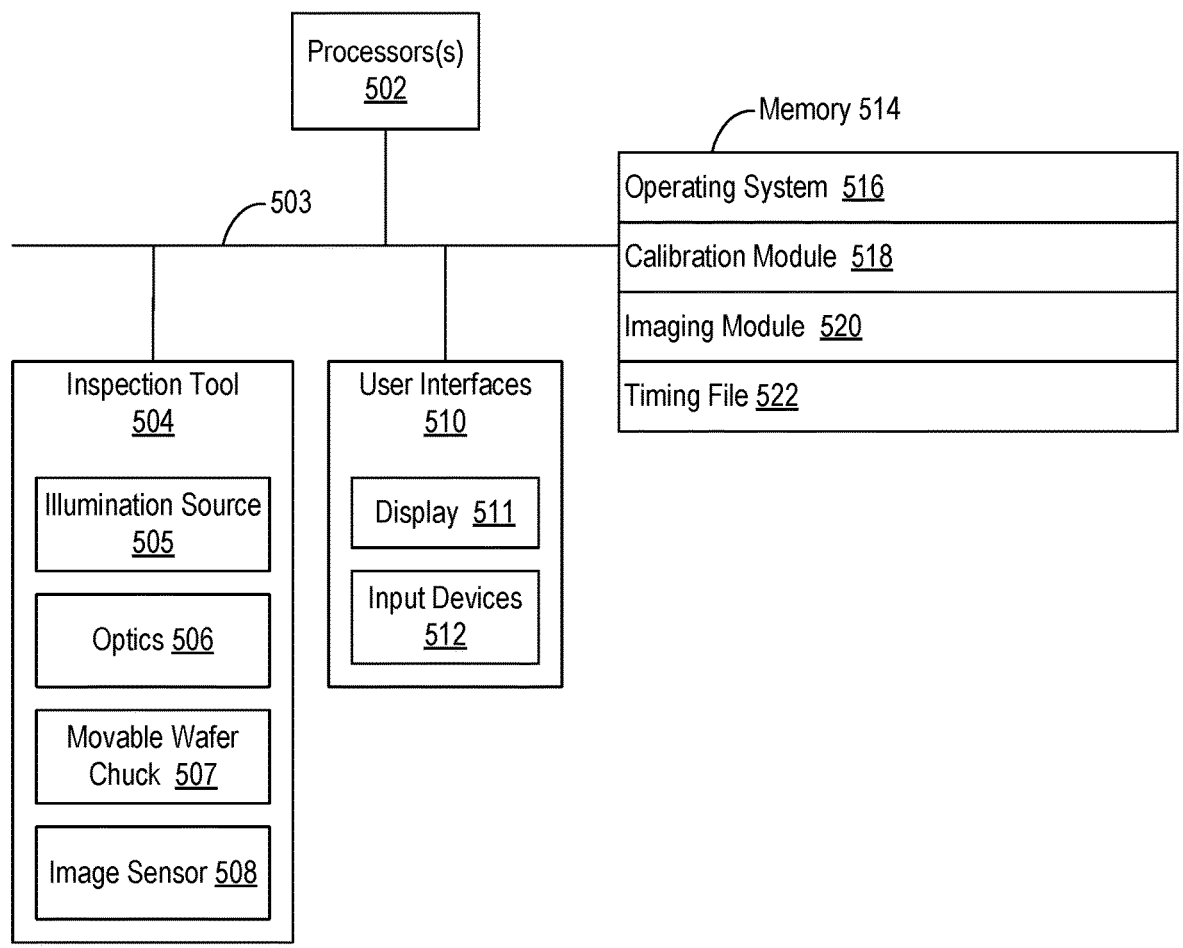
FIG. 5 is a block diagram of a semiconductor-inspection system in accordance with some embodiments.

FIG. 5 is a block diagram of a semiconductor-inspection system 500 that may be used to perform the method 300 (FIG. 3A) in accordance with some embodiments. The semiconductor-inspection system 500 includes a semiconductor inspection tool 504 and an associated computer system that includes one or more processors 502 (e.g., CPUs), user interfaces 510, memory 514, and one or more communication buses 503 interconnecting these components. The semiconductor-inspection system 500 may also include one or more network interfaces (wired and/or wireless, not shown) for communicating with (e.g., retrieving recipes from and/or transmitting data to) remote computer systems.

The inspection tool 504 includes an illumination source 505, illumination and collection optics 506, a movable wafer chuck 507, and an image sensor 508 (e.g., a back-illuminated TDI image sensor). The image sensor 508 may have a multi-tap architecture such as the multi-tap architecture of FIG. 2. Semiconductor wafers are loaded onto the movable wafer chuck 507, which moves during inspection of a die (e.g., to perform TDI).

The user interfaces 510 may include a display 511 and one or more input devices 512 (e.g., a keyboard, mouse, touch-sensitive surface of the display 511, etc.). The display 511 may display imaging results (e.g., results of defect detection). For example, the display 511 may display the result of step 322 of the method 300 (FIG. 3A).

Memory 514 includes volatile and/or non-volatile memory. Memory 514 (e.g., the non-volatile memory within memory 514) includes a non-transitory computer-readable storage medium. Memory 514 optionally includes one or more storage devices remotely located from the processors 502 and/or a non-transitory computer-readable storage medium that is removably inserted into the computer system. In some embodiments, memory 514 (e.g., the non-transitory computer-readable storage medium of memory 514) stores the following modules and data, or a subset or superset thereof: an operating system 516 that includes procedures for handling various basic system services and for performing hardware-dependent tasks, a calibration module 518 (e.g., for causing all or a portion of steps 310-320 of the method 300, FIG. 3A, to be performed), and an imaging module 520 (e.g., for causing step 322 of the method 300, FIG. 3A, to be performed). The memory 514 may also store a timing file 522 that specifies clock timing. The timing file 522 is generated by the calibration module 518 and accessed by the imaging module 520 for use in imaging targets.

The memory 514 (e.g., the non-transitory computer-readable storage medium of the memory 514) thus includes instructions for performing all or a portion of steps 310-322 of the method 300 (FIG. 3A), and may include instructions for performing the method 350 (FIG. 3B). Each of the modules stored in the memory 514 corresponds to a set of instructions for performing one or more functions described herein. Separate modules need not be implemented as separate software programs. The modules and various subsets of the modules may be combined or otherwise re-arranged. In some embodiments, the memory 514 stores a subset or superset of the modules and/or data structures identified above.

FIG. 5 is intended more as a functional description of the various features that may be present in a semiconductor-inspection system than as a structural schematic. For example, the arrangement of the components of the inspection tool 504 may vary (e.g., in manners known in the art). Items shown separately could be combined and some items could be separated. Furthermore, the functionality of the semiconductor-inspection system 500 may be split between multiple devices. For example, a portion of the modules stored in the memory 514 may alternatively be stored in one or more computer systems communicatively coupled with the semiconductor-inspection system 500 through one or more networks.

The method 300 may be combined with techniques for improving the alternating-current (AC) ground return in the pixel array or for modulating the sensor-diffusion modulation transfer function ($MTF_{diffusion}$). $MTF_{diffusion}$ is defined as the charge from a single pixel that leaks into adjacent pixels and is one factor in the overall imaging MTF. $MTF_{diffusion}$ may be degraded to mitigate aliasing and may be enhanced to offset MTF degradation from substrate thickness at longer wavelengths.

Returning to FIG. 1B, the region 126 may be connected to ground at the edge of or outside the pixel array but is otherwise floating, and thus offers at best a high-resistance path to ground. Providing electrically conductive contacts to the region 126 inside the pixel array, however, would provide an extra variable in the operation of an image sensor. The region 126 could be grounded through the contacts to provide an AC ground return for feedthrough. The region 126 could also be positively or negatively biased through the contacts to modulate the depletion region in the substrate 128 and thereby enhance or degrade $MTF_{diffusion}$.

Figure 6:
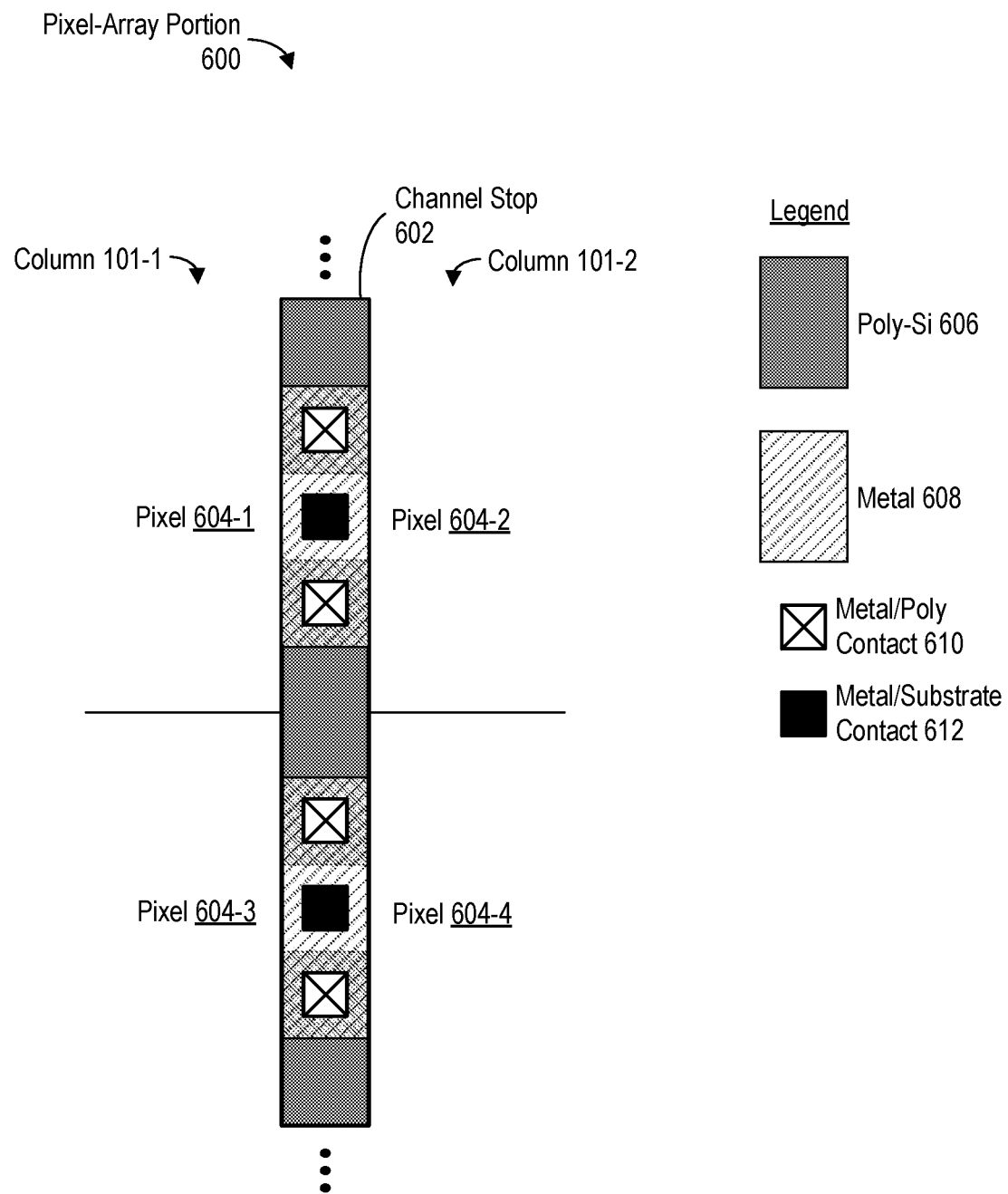
FIG. 6 is a plan view of a portion of a pixel array in an image sensor, in which a sequence of electrically connected polysilicon segments and overlapping metal segments overlay a channel stop, with the metal segments being electrically connected to a doped region of the channel stop through contacts, in accordance with some embodiments.

FIG. 6 is a plan view of a portion 600 of a pixel array in an image sensor in accordance with some embodiments. In the portion 600, a channel stop 602 with a structure similar to the channel stop 108 (FIGS. 1A-1B) isolates pixels 604-1 and 604-3 (and thus their corresponding gates 102) in the first pixel column 101-1 from respective adjacent pixels 604-2 and 604-4 (and their corresponding gates 102) in the adjacent second pixel column 101-2. In some embodiments (e.g., for 2 um design rules), the channel stop 602 has a width of 4-6 um and extends for a depth of 1-2 um with respect to the surface of the substrate 128.

An alternating sequence of electrically conductive polysilicon segments 606 and metal segments 608 overlay (i.e., are situated above and extend along the direction of) the channel stop 602, and thus are situated above the LOCOS 120 (FIG. 1B) of the channel stop 602. The metal segments 608 overlap respective polysilicon segments 606: each metal segment 608 overlaps previous and subsequent polysilicon segments 606 (except, e.g., at the top and bottom edges of the pixel array). The corresponding metal and polysilicon layers are separated by one or more dielectric layers. The polysilicon layer may be deposited directly on the LOCOS 120. Electrically conductive metal/poly contacts 610 extend between and electrically connect the metal segments 608 and their respective previous and subsequent polysilicon segments 606, thereby creating a conductor that extends along the channel stop 602. This conductor comprises the polysilicon segments 606, metal segments 608, and metal/poly contacts 610. Metal/substrate contacts 612 extend between and electrically connect respective metal segments 608 (e.g., each metal segment 608) and the region 126 (FIG. 1B) of the channel stop 602, and form respective ohmic contacts with the region 126. The metal/substrate contacts 612 thus extend through the LOCOS 120. The metal/substrate contacts 612 are formed beneath portions of the metal segments 608 that do not have polysilicon segments 606 directly underneath, in accordance with some embodiments.

In some embodiments, there are two metal/poly contacts 610 and one metal/substrate contact 612 per pixel (i.e., per adjacent pair of pixels). In some embodiments, there are two metal/poly contacts 610 and one metal/substrate contact 612 per n pixels (e.g., per $2^n$ pixels), where n may be an integer. For example, there may be two metal/poly contacts 610 and one metal/substrate contact 612 per n pixels, where n is an integer less than or equal to eight.

Figure 7A:
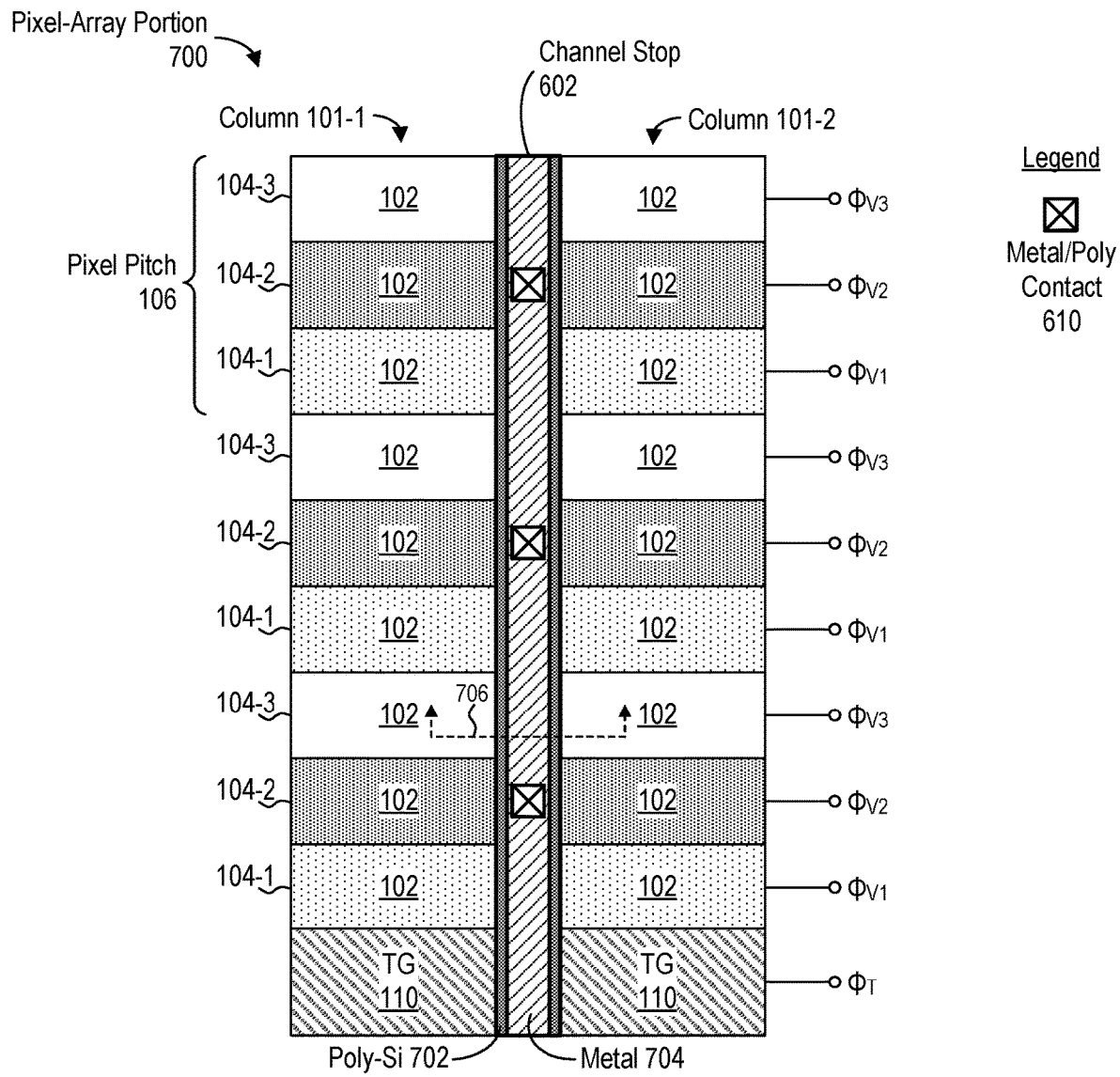
FIG. 7A is a plan view of a portion of a pixel array in an image sensor, in which a polysilicon line overlays and is electrically connected to a channel stop, and a metal line overlays and is electrically connected to the polysilicon line in accordance with some embodiments.
Figure 7B:
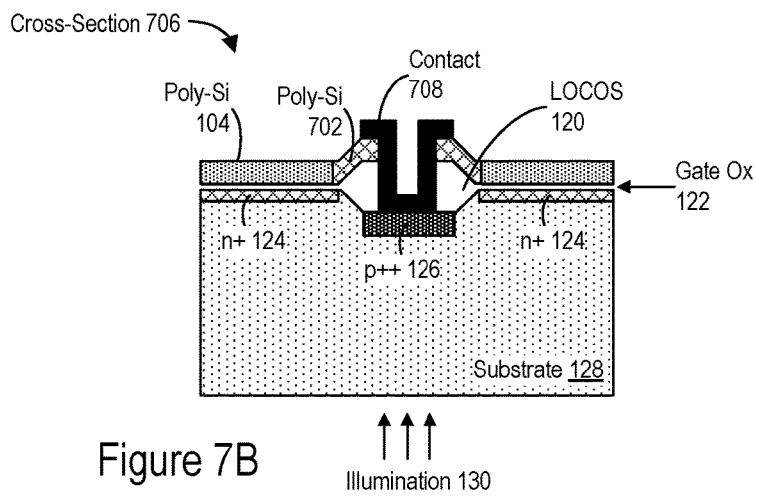
FIG. 7B shows a cross-section of two gates and an intervening channel stop in the pixel-array portion of FIG. 7A, in accordance with some embodiments.

FIG. 7A is a plan view of a portion 700 of a pixel array in an image sensor that is an alternative to the portion 600 (FIG. 6) in accordance with some embodiments. FIG. 7B shows a cross-section 706 of two gates 102 and the intervening channel stop 602 in the portion 700, in accordance with some embodiments. In the portion 700, an electrically conductive polysilicon line 702 is situated above and extends along the channel stop 602. An electrically conductive contact 708 extends through the polysilicon line 702 and LOCOS 120 to the region 126, as shown in the cross-section 706, and forms an ohmic contact with the region 126. The polysilicon line 702 is in contact with, and thus is electrically connected to, the contact 708. A metal line 704 is situated above and extends along the polysilicon line 702 and channel stop 602. As in the portion 600 (FIG. 6), the corresponding metal and polysilicon layers are separated by one or more dielectric layers. Metal/poly contacts 610 (e.g., a series of such contacts) extend between and electrically connect the polysilicon line 702 and metal line 704. Strapping the polysilicon line 702 to the metal line 704 in this manner provides a low-resistance connection from the contact 708 and region 126 to an external point of connection (e.g., to ground or to a power supply). In some embodiments, the metal line 704 is omitted and the connection from the contact 708 and region 126 to the external point of connection is through the polysilicon line 702.

In some embodiments, there is one contact 708 and/or one metal/poly contact 610 per pixel, multiple contacts 708 and/or multiple metal/poly contacts 610 per pixel (e.g., one per gate 102), or one contact 708 and/or one metal/poly contact 610 per n pixels (e.g., per $2^n$ pixels), where n may be an integer. For example, there may be one contact 708 and/or one metal/poly contact 610 per n pixels, where n is an integer less than or equal to eight.

As described with respect to FIG. 1A, a full pixel array may include a repeating sequence of pairs of pixel columns 101 with respective intervening channel stops 602 between the pixel columns 101 of each pair. Each channel stop 108 is thus one of a plurality of channel stops 108 that isolate the pixel columns 101 of respective pairs of pixel columns 101. Each pair of pixel columns 101 may be separated from the next pair of pixel columns 101 by another channel stop 602 or by an anti-blooming structure. A plurality of electrically conductive contacts 612 (FIG. 2) or 708 (FIG. 7B) extend through the LOCOS structures 120 and form ohmic contacts with the regions 126 of the channel stops 602.

Figure 8:
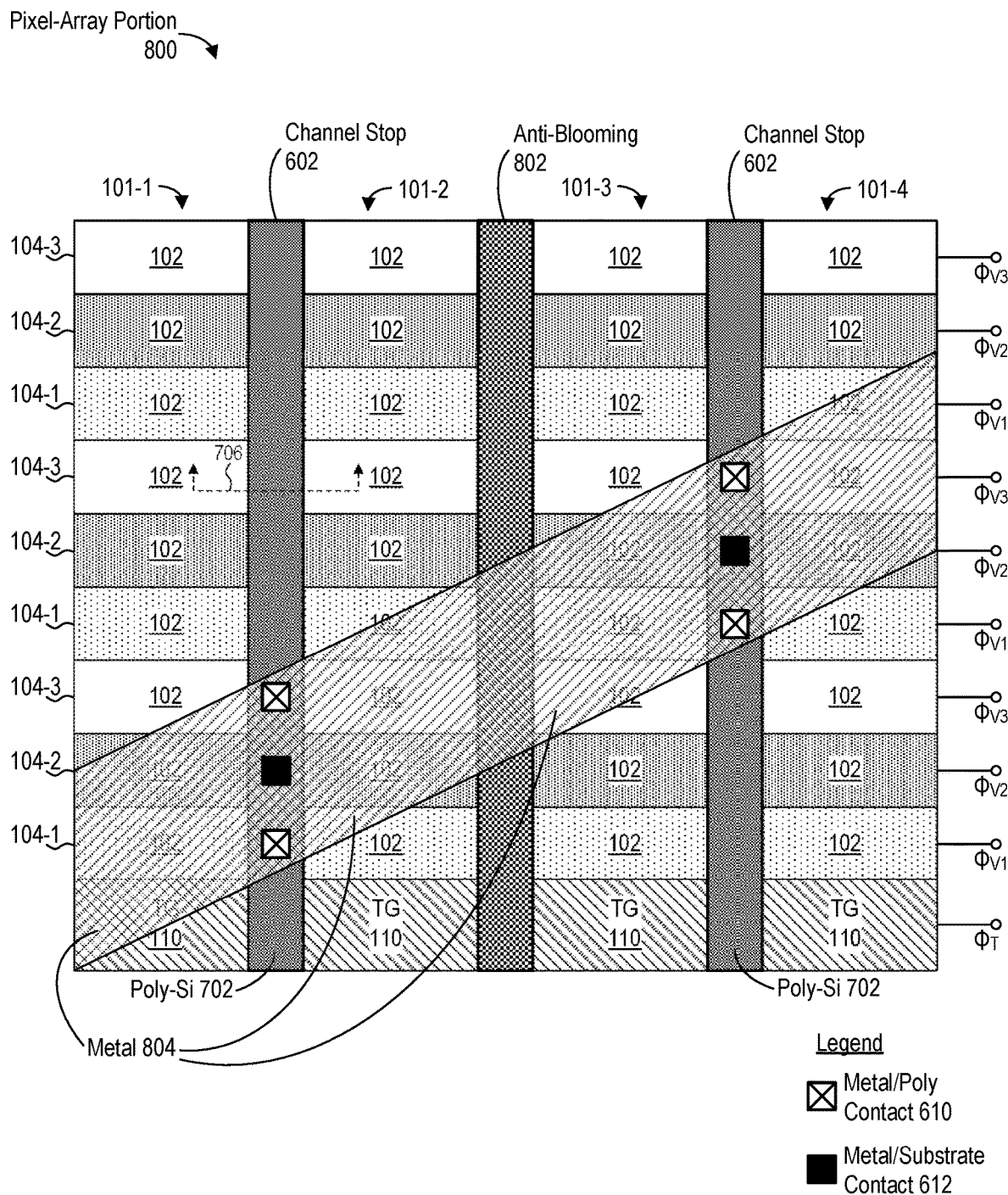
FIG. 8 is a plan view of a portion of a pixel array in which a metal line crosses a plurality of pairs of pixel columns at a slant and is electrically connected to corresponding channel stops, in accordance with some embodiments.

FIG. 8 is a plan view of a portion 800 of a pixel array in an image sensor in which a first pair of pixel columns 101-1 and 101-2 are separated from a second pair of pixel columns 101-3 and 101-4 by an anti-blooming structure 802 (or alternatively another channel stop), in accordance with some embodiments. These first and second pairs of pixel columns are part of a plurality of pairs of pixel columns in a pixel array, each with a respective channel stop 602 between the pixel columns 101 of the pair. A metal line 804 crosses above the plurality of pairs of pixel columns 101. In some embodiments, the metal line 804 is oriented at a slant with respect to the plurality of pairs of pixel columns 101. A plurality of metal/substrate contacts 612 extends between and electrically connect the metal line 804 and regions 126 of the channel stops 602. In some embodiments, polysilicon lines 702 are situated above and extend along respective channel stops 602, and metal/poly contacts 610 extend between the metal line 804 and the polysilicon lines 702. The metal line 804 may be used (e.g., in conjunction with the polysilicon lines 702) to ground, negatively bias, and/or positively bias the metal/substrate contacts 612 and regions 126.

Figure 9A:
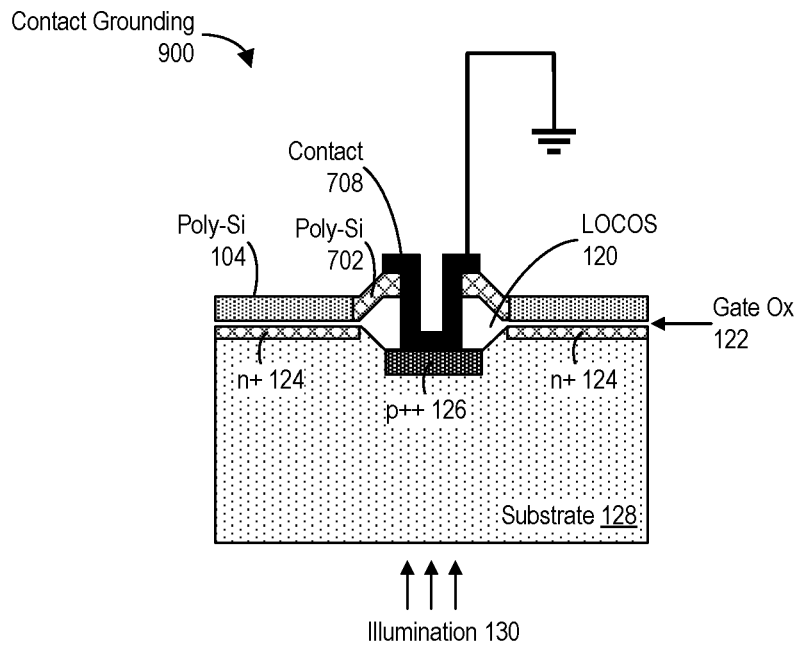
FIG. 9A is a schematic illustration showing the grounding of a channel-stop contact in accordance with some embodiments.

FIG. 9A is a schematic illustration showing the grounding 900 of a contact 708 in accordance with some embodiments. The contact 708 may be connected to ground through the polysilicon line 702, metal/poly contacts 610, and/or metal line 704 (FIG. 7A), as well as metal lines in the periphery of the sensor chip that includes the pixel array. Similarly, a metal/substrate contact 612 may be connected to ground through the conductive structures shown in FIGS. 6 and 8, as well as metal lines in the periphery of the sensor chip that includes the pixel array. Grounding such contacts provides a ground return that prevents feedthrough caused by unbalance clock signals from affecting the readout amplifiers. Imaging performance is thus improved and imaging can be performed at higher line rates than would otherwise be possible. Grounding such contacts may also provide other benefits, such as reducing plasma-induced charge damage during fabrication and thus improving yield, reducing mechanical stress, and enhancing MTF by improving operation of the channel stop.

Figure 9B:
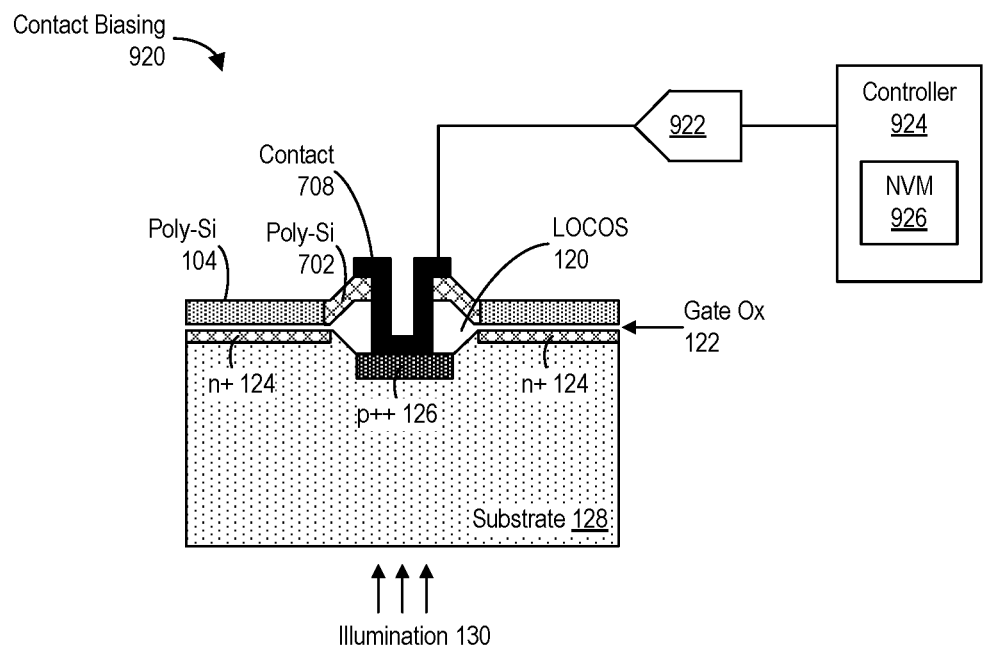
FIG. 9B is a schematic illustration showing the biasing of a channel-stop contact in accordance with some embodiments.

FIG. 9B is a schematic illustration of the positive and/or negative biasing of a contact 708 in accordance with some embodiments. The contact 708 or a metal/substrate contact 612 is electrically connected to a programmable power supply 922 (e.g., a digital-to-analog converter (DAC)), for example through one of the conductive structures shown in FIGS. 6, 7A, and 8 as well as metal lines in the periphery of the sensor chip that includes the pixel array. In some embodiments, the power supply 922 is controlled by a controller 924 (e.g., a microcontroller or FPGA), which provides digital signals to the power supply 922 specifying the bias voltage to be provided by the power supply 922. This bias voltage may vary as a function of the imaging wavelength(s), the target being imaged, and/or other factors (e.g., whether the imaging is brightfield or darkfield). In some embodiments, the controller 924 includes non-volatile memory 926 that includes a non-transitory computer-readable medium storing instructions, configured for execution by the controller 924, for providing the digital signals specifying the bias voltage.

In some embodiments, the bias voltage provided by the power supply 922 may be adjusted in real time, during the imaging process, to allow dynamic adjustment of the imaging process.

Negatively biasing the contact 708 (or metal/substrate contact 612) degrades $\text{MTF}_{diffusion}$ and thus reduces or eliminates aliasing, with potentially little to no impact on the sensor full-well capacity. Negative biasing achieves this result by reducing the extent of the depletion region in the substrate 128: the more negative the bias, the smaller the depletion region and the larger the field-free region near the back surface of the substrate 128. Increasing the extent of the field-free region increases charge diffusion, which degrades $\text{MTF}_{diffusion}$. Negative biasing may be used in brightfield imaging to image as much light as possible on the sensor (e.g., using a UV or deep UV broadband light source) and to improve darkfield inspection performance by allowing the collection of high-angle scattering from small defects without aliasing.

Positively biasing the contact 708 (or metal/substrate contact 612) enhances $\text{MTF}_{diffusion}$ and thus allows multi-spectral imaging: an imaging sensor with a substrate 128 thick enough (e.g., 30 um thick) to support imaging at long wavelengths (e.g., red or infrared, where infrared may extend to 900 nm or more) can also be used to perform imaging at shorter wavelengths (e.g., blue, UV, or deep UV, where deep UV may be defined as 190 nm to 355 nm). In one example, the same imaging sensor may be used to perform imaging at 405 nm, 600 nm, and 900 nm. Positive biasing achieves this result by increasing the extent of the depletion region in the substrate 128: the more positive the bias, the larger the depletion region and the smaller the field-free region near the back surface of the substrate 128. Decreasing the extent of the field-free region decreases charge diffusion, which enhances $\text{MTF}_{diffusion}$.

The precise degree of depletion may be simulated for a specific pixel structure using known simulation software (e.g., 2-D simulation software from Silvaco, Inc.).

Figure 10:
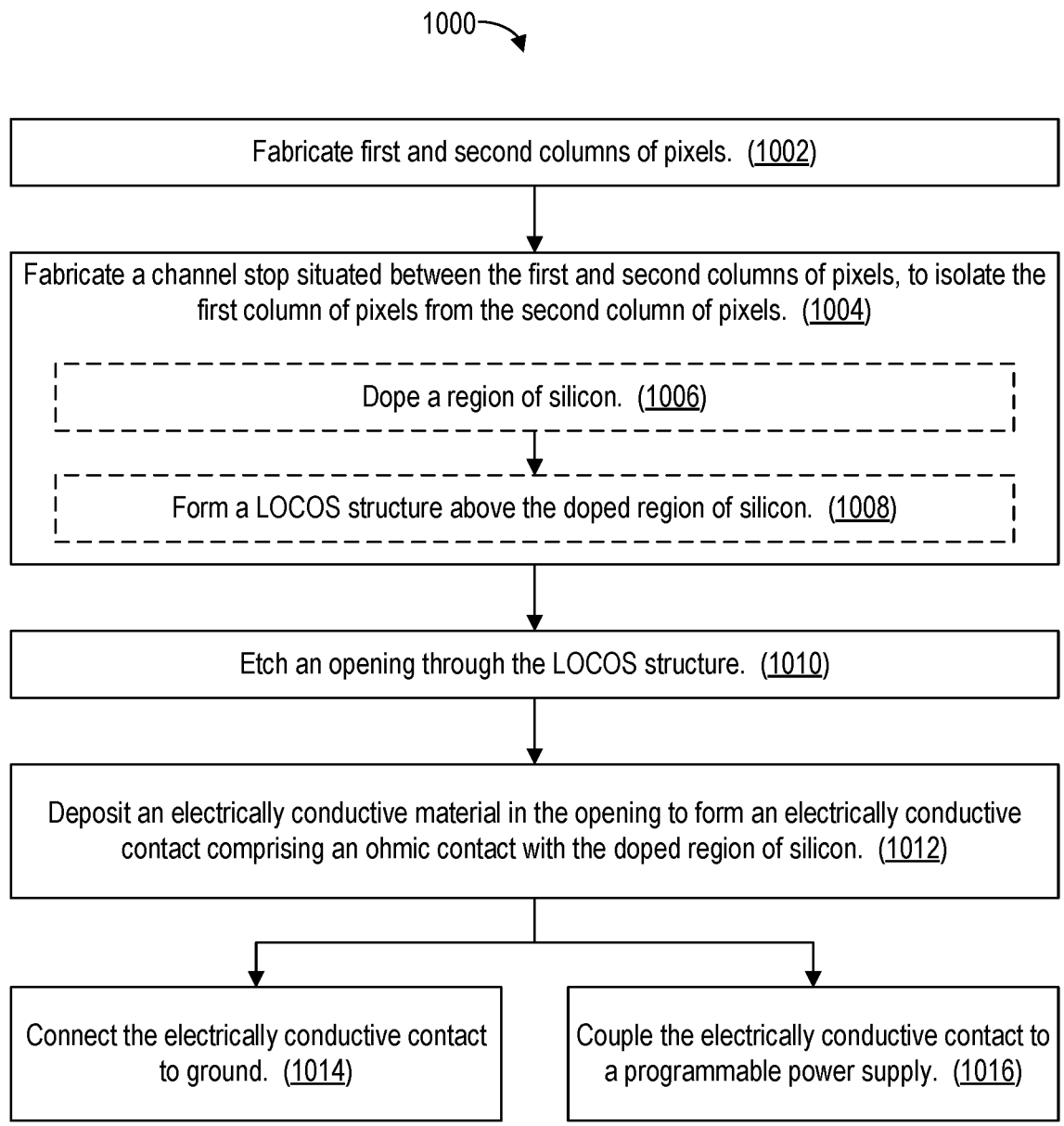
FIG. 10 is a flowchart showing a method of fabricating a back-illuminated image sensor, in accordance with some embodiments.

FIG. 10 is a flowchart showing a method 1000 of fabricating a back-illuminated image sensor, in accordance with some embodiments. In the method 1000, first and second columns of pixels (e.g., columns 101-1 and 101-2, FIG. 6, 7A, or 8) are fabricated (1002). A channel stop (e.g., channel stop 602, FIGS. 6-8) situated between the first and second columns of pixels is also fabricated (1004), to isolate the first column of pixels from the second column of pixels. To fabricate the channel stop, a region of silicon (e.g., region 126, FIG. 7B) is doped (1006), for example using implantation, and a LOCOS structure (e.g., LOCOS 120, FIG. 7B) is formed (1008) above the doped region of silicon. A portion of the doped region of silicon may be consumed in step 1008 when forming the LOCOS structure.

An opening is etched (1010) through the LOCOS structure. Electrically conductive material (e.g., aluminum) is deposited (1012) in the opening to form an electrically conductive contact (e.g., metal/substrate contact 612, FIG. 6 or 8; contact 708; FIG. 7B) comprising an ohmic contact with the doped region of silicon.

In some embodiments, the electrically conductive contact is connected (1014) to ground. For example, the electrically conductive contact is coupled to one or more ground pins of a sensor chip on which the structures of the method 1000 are situated. In some embodiments, the electrically conductive contact is coupled (1016) to a programmable power supply (e.g., power supply 922, FIG. 9B), which may be implemented on the sensor chip on which the structures of the method 1000 are situated or on a separate chip.

Steps in the method 1000 may be combined or broken out and steps that are not order-dependent may be reordered (e.g., in accordance with known semiconductor-processing techniques).

Figure 11:
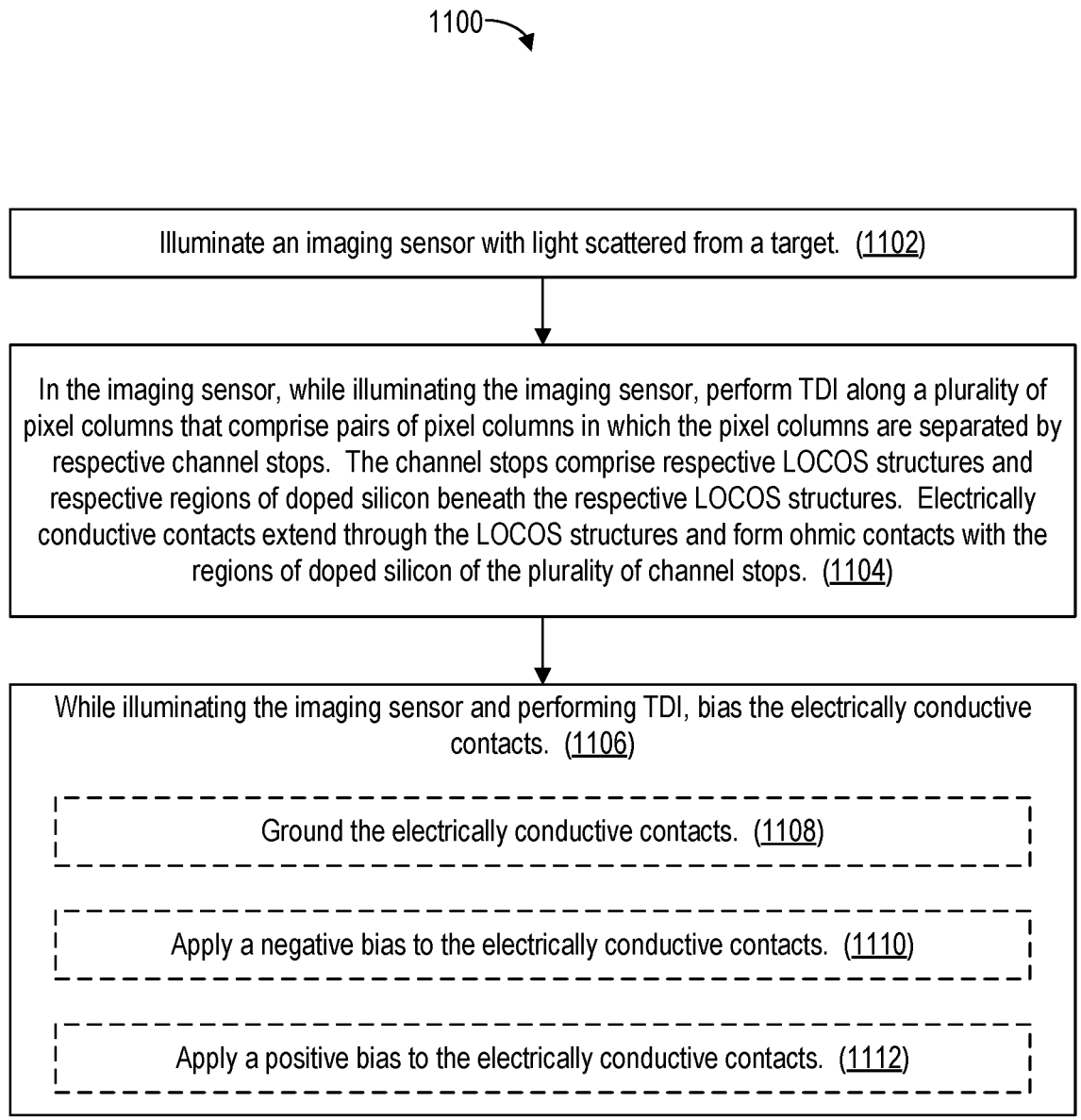
FIG. 11 is a flowchart showing a method of performing imaging, in accordance with some embodiments.

FIG. 11 is a flowchart showing a method 1100 of performing imaging, in accordance with some embodiments. In the method 1100, an imaging sensor (e.g., as fabricated per the method 1000, FIG. 10) is illuminated (1102) with light scattered from a target (e.g., a semiconductor wafer). In the imaging sensor, while illuminating the imaging sensor, time-domain integration (TDI) is performed (1104) along a plurality of pixel columns that comprise pairs of pixel columns (e.g., columns 101-1 and 101-2, FIG. 6, 7A, or 8) in which the pixel columns are separated by respective channel stops (e.g., channel stops 602, FIGS. 6-8). The channel stops comprise respective LOCOS structures (e.g., LOCOS 120, FIG. 7B) and respective regions of doped silicon (e.g., regions 126, FIG. 7B) beneath the respective LOCOS structures. Electrically conductive contacts (e.g., metal/substrate contacts 612, FIG. 6 or 8; contacts 708; FIG. 7B) extend through the LOCOS structures and form ohmic contacts with the regions of doped silicon of the plurality of channel stops.

While illuminating the imaging sensor and performing TDI, the electrically conductive contacts are biased (1106). In some embodiments, the electrically conductive contacts are biased by grounding them (1108), as shown for example in FIG. 9A. In some embodiments, a negative bias (1110) or positive bias (1112) is applied to the electrically conductive contacts, as shown for example in FIG. 9B.

In some embodiments, the bias applied to the electrically conductive contacts of channel stops may be varied dynamically during imaging. The bias applied to the electrically conductive contacts of channel stops may be varied dynamically along with (e.g., in conjunction with) dynamic variation of the magnitude of vertical-register clock signals applied to gates 102. For example, the magnitude of the vertical-register clock signals may be reduced during imaging to reduce noise, and the channel-stop electrically conductive contacts may be positively biased (or a positive bias may be increased) to offset reduction in $\text{MTF}_{diffusion}$ resulting from the reduced magnitude of the vertical-register clock signals. The positive bias applied to the channel-stop electrically conductive contacts should be limited to a value that does not cancel out the barrier-phase operation of the vertical-register clock signals when the vertical-register clock signals are negative.

In some embodiments, control of the bias applied to channel-stop electrically conductive contacts may be segmented, such that groups of pixels (e.g., groups of 256 pixels) may have this bias set and adjusted independently of other groups of pixels.

In some embodiments, channel stops between the two columns of pixels in each pair of pixel columns may have a non-zero bias applied (e.g., adjustably applied) to their electrically conductive contacts during imaging, while channel stops between adjacent pairs of pixel columns may have their electrically conductive contacts grounded during imaging (or vice-versa). Such an arrangement provides improved AC ground return while also allowing for modulation of $MTF_{diffusion}$.

Figure 12:
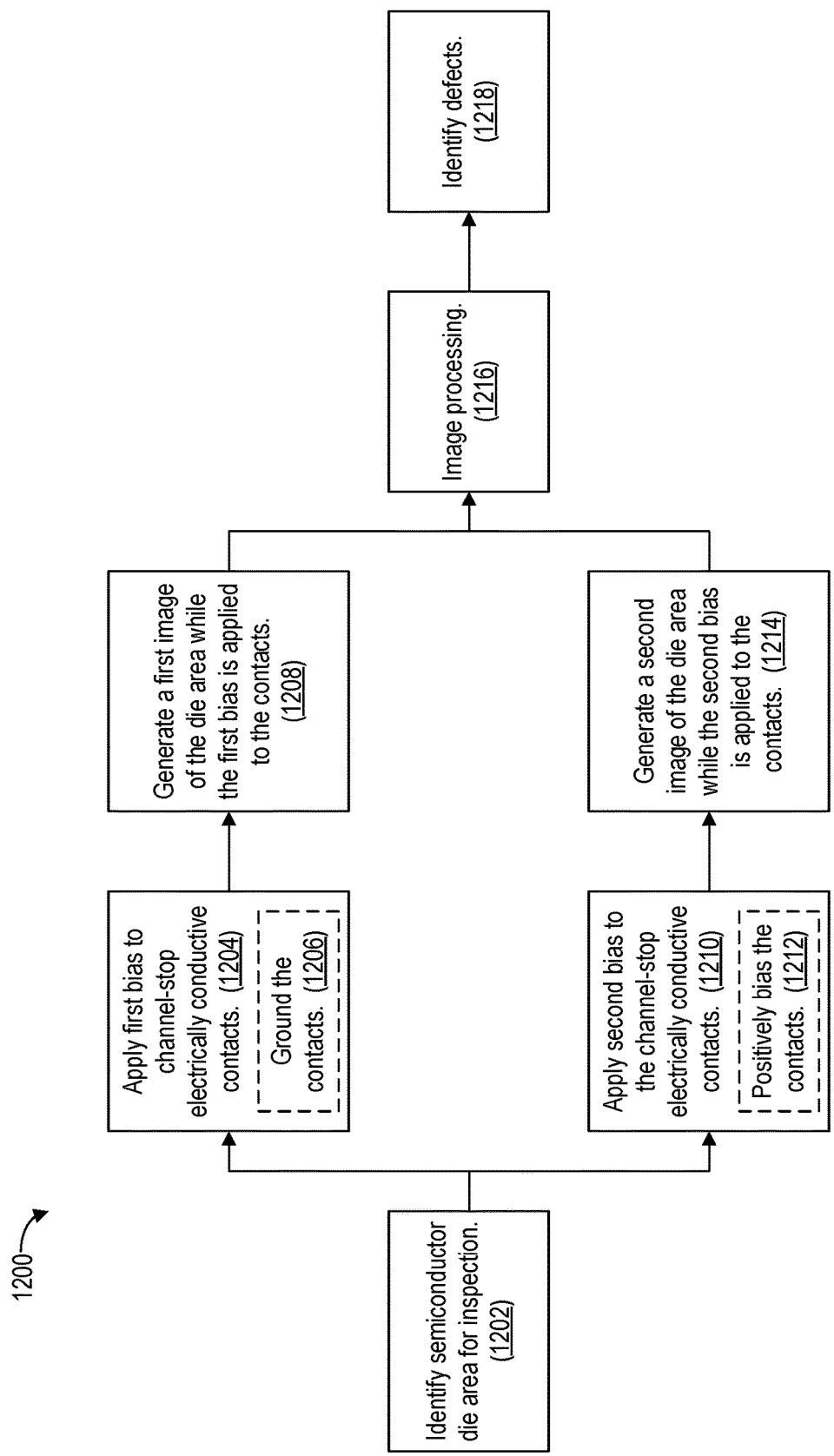
FIG. 12 is a flowchart showing a method of performing multi-pass imaging with variable channel-stop contact biasing, in accordance with some embodiments.

FIG. 12 is a flowchart showing a method 1200 of performing multi-pass imaging with variable channel-stop contact biasing, in accordance with some embodiments. The method 1200 may be performed using a semiconductor-inspection system 500 (FIG. 5), which includes an image sensor 508 (e.g., as fabricated per the method 1000, FIG. 10).

In the method 1200, an area of a semiconductor die is identified (1202) for inspection. The identified die area (i.e., the area of inspection) may include the entire die or a portion of the die. Two imaging passes for the area of inspection are then performed. In a first pass, a first bias is applied (1204) to channel-stop electrically conductive contacts (e.g., metal/substrate contacts 612, FIG. 6 or 8; contacts 708; FIG. 7B). For example, the electrically conductive contacts are grounded (1206) to provide a low (i.e., good) noise floor for the image sensor. A first image of the die area is generated (1208) while the first bias is applied to the contacts. The first pass may be performed as a first instance of the method 1100 (FIG. 11) (e.g., as an instance of the method 1100 in which the electrically conductive contacts are grounded in accordance with step 1108). Performing the first pass thus may include performing a first instance of TDI along a plurality of pixel columns in the image sensor, while illuminating the imaging sensor with light scattered from the semiconductor die or portion thereof. The plurality of pixel columns may comprise pairs of pixel columns (e.g., columns 101-1 and 101-2, FIG. 6, 7A, or 8) in which the pixel columns are separated by respective channel stops, wherein the channel stops include respective LOCOS structures (e.g., LOCOS 120, FIG. 7B), respective regions of doped silicon beneath the respective LOCOS structures (e.g., regions 126, FIG. 7B), and respective electrically conductive contacts (e.g., metal/substrate contacts 612, FIG. 6 or 8; contacts 708; FIG. 7B). The electrically conductive contacts extend through the LOCOS structures and form ohmic contacts with the regions of doped silicon.

In a second pass, a second bias is applied (1210) to the channel-stop electrically conductive contacts. The second bias is distinct from the first bias. For example, a positive bias (e.g., less than, or less than or equal to, 6V) is applied (1212) to the electrically conductive contacts, to enhance $MTF_{diffusion}$. (Again, the positive bias applied to the channel-stop electrically conductive contacts should be limited to a value that does not cancel out the barrier-phase operation of the vertical-register clock signals when the vertical-register clock signals are negative.) A second image of the die area is generated (1214) while the second bias is applied to the contacts. The second pass may be performed as a second instance of the method 1100 (FIG. 11) (e.g., as an instance of the method 1100 in which the electrically conductive contacts are positively biased in accordance with step 1112). Performing the second pass thus may include performing a second instance of TDI along a plurality of pixel columns in the image sensor, while illuminating the imaging sensor with light scattered from the semiconductor die or portion thereof.

The first pass may be performed before or after the second pass.

In some embodiments, the respective channel stops that separate the pixel columns in the pairs of pixel columns compose a first plurality of channel stops. The first plurality of channel stops thus isolates the columns within each pair of pixel columns from each other. The image sensor, in addition to comprising the first plurality of channel stops, further comprises a second plurality of channel stops that separate adjacent pairs of pixel columns. The second plurality of channel stops thus isolates adjacent pairs of pixel columns from each other. The second plurality of channel stops, like the first plurality of channel stops, comprises respective LOCOS structures, respective regions of doped silicon beneath the respective LOCOS structures, and electrically conductive contacts that extend through the LOCOS structures of the second plurality of channel stops and form ohmic contacts with the regions of doped silicon of the second plurality of channel stops. The electrically conductive contacts of the second plurality of channel stops may be grounded while performing both the first instance of TDI and while performing the second instance of TDI, whereas the biasing of the electrically conductive contacts of the first plurality of channel stops varies between the two instances of TDI.

After the two imaging passes have been performed, image processing is performed (1216) on the resulting first and second images, and defects in the area of inspection on the semiconductor die are identified (1218). While steps 1216 and 1218 are shown in FIG. 12 as separate steps, they may be considered respective parts of a single defect-identification step. In some embodiments, the image processing (1216) includes combining the first and second images to generate a third image (e.g., a composite of the first and second images). The defect identification (1218) includes comparing the third image to a reference image (e.g., an image of a corresponding area of inspection on another die, a composite image of the area inspection for multiple other die, or an image generated based on the layout of the area of inspection as specified in a design file such as a gds file).

The method 1200 results in a higher signal-to-noise ratio for defect identification than would result from defect identification based on a single imaging pass alone. For example, the method 1200 may benefit from a combination of the low-noise floor of the first image (e.g., in accordance with step 1206) and the enhanced $MTF_{diffusion}$ of the second image (e.g., in accordance with step 1212).

In some embodiments, the memory 514 (FIG. 5) (e.g., the imaging module 520) includes instructions for performing all or a portion of the method 1200. For example, the memory 514 (e.g., the imaging module 520) includes instructions for performing steps 1202, 1216, and/or 1218 and also includes steps for causing the inspection tool 504 to perform steps 1204, 1206, 1208, 1210, 1212, and/or 1214.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An imaging method, comprising:
generating a first image of a semiconductor die or portion thereof, comprising:
in an imaging sensor, while illuminating the imaging sensor with light scattered from the semiconductor die or portion thereof, performing a first instance of time-domain integration (TDI) along a plurality of pixel columns comprising pairs of pixel columns in which the pixel columns are separated by respective channel stops, wherein the channel stops comprise respective localized oxidation of silicon (LOCOS) structures, respective regions of doped silicon beneath the respective LOCOS structures, and electrically conductive contacts that extend through the LOCOS structures and form ohmic contacts with the regions of doped silicon; and
while performing the first instance of TDI, applying a first bias to the electrically conductive contacts;
generating a second image of the semiconductor die or portion thereof, comprising:
in the imaging sensor, while illuminating the imaging sensor with light scattered from the semiconductor die or portion thereof, performing a second instance of TDI along the plurality of pixel columns; and
while performing the second instance of TDI, applying a second bias to the electrically conductive contacts; and
identifying defects in the semiconductor die or portion thereof using the first and second images.

2. The method of claim 1, wherein:
applying the first bias to the electrically conductive contacts comprises grounding the electrically conductive contacts; and
applying the second bias to the electrically conductive contacts comprises applying a positive bias to the electrically conductive contacts.

3. The method of claim 2, wherein the positive bias is less than or equal to six volts.

4. The method of claim 1, wherein identifying the defects comprises:
combining the first and second images to generate a third image; and
comparing the third image to a reference image of the semiconductor die or portion thereof.

5. The method of claim 4, wherein:
applying the first bias to the electrically conductive contacts comprises grounding the electrically conductive contacts; and
applying the second bias to the electrically conductive contacts comprises applying a positive bias to the electrically conductive contacts.

6. The method of claim 1, wherein:
the respective channel stops that separate the pixel columns in the pairs of pixel columns compose a first plurality of channel stops;
the image sensor, in addition to comprising the first plurality of channel stops, further comprises a second plurality of channel stops that separate adjacent pairs of pixel columns;
the second plurality of channel stops comprises respective LOCOS structures, respective regions of doped silicon beneath the respective LOCOS structures, and electrically conductive contacts that extend through the LOCOS structures of the second plurality of channel stops and form ohmic contacts with the regions of doped silicon of the second plurality of channel stops; and
the method further comprises grounding the electrically conductive contacts of the second plurality of channel stops while performing the first instance of TDI and while performing the second instance of TDI.

7. A non-transitory computer-readable storage medium storing one or more programs for execution by one or more processors of a computer system that is communicatively coupled with an inspection tool comprising an image sensor, the image sensor comprising pairs of pixel columns in which the pixel columns are separated by respective channel stops, wherein the channel stops comprise respective LOCOS structures, respective regions of doped silicon beneath the respective LOCOS structures, and electrically conductive contacts that extend through the LOCOS structures and form ohmic contacts with the regions of doped silicon, the one or more programs including instructions for:
causing the inspection tool to generate a first image of a semiconductor die or portion thereof, comprising causing the image sensor to perform a first instance of TDI along at least a portion of the pairs of pixel columns while illuminating the imaging sensor with light scattered from the semiconductor die or portion thereof and while a first bias is applied to the electrically conductive contacts;
causing the inspection tool to generate a second image of the semiconductor die or portion thereof, comprising causing the image sensor to perform a second instance of TDI along at least the portion of the pairs of pixel columns while illuminating the imaging sensor with light scattered from the semiconductor die or portion thereof and while a second bias is applied to the electrically conductive contacts; and
identifying defects in the semiconductor die or portion thereof using the first and second images.

8. The computer-readable storage medium of claim 7, wherein:
the second bias is a positive bias; and
the first bias is ground.

9. The computer-readable storage medium of claim 8, wherein the positive bias is less than or equal to six volts.

10. The computer-readable storage medium of claim 7, wherein the instructions for identifying the defects comprise:
instructions for combining the first and second images to generate a third image; and
instructions for comparing the third image to a reference image of the semiconductor die or portion thereof.

11. The computer-readable storage medium of claim 10, wherein:
the second bias is a positive bias; and
the first bias is ground.

12. The computer-readable storage medium of claim 7, wherein:
the respective channel stops that separate the pixel columns in the pairs of pixel columns compose a first plurality of channel stops;

the image sensor, in addition to comprising the first plurality of channel stops, further comprises a second plurality of channel stops that separate adjacent pairs of pixel columns;

the second plurality of channel stops comprises respective LOCOS structures, respective regions of doped silicon beneath the respective LOCOS structures, and electrically conductive contacts that extend through the LOCOS structures of the second plurality of channel stops and form ohmic contacts with the regions of doped silicon of the second plurality of channel stops; and the instructions to cause the inspection tool to generate the first and second images comprise instructions to cause the image sensor to perform the first and second instances of TDI while the electrically conductive contacts of the second plurality of channel stops are grounded.

13. A semiconductor-inspection system, comprising:
an inspection tool comprising an image sensor, the image sensor comprising pairs of pixel columns in which the pixel columns are separated by respective channel stops, wherein the channel stops comprise respective LOCOS structures, respective regions of doped silicon beneath the respective LOCOS structures, and electrically conductive contacts that extend through the LOCOS structures and form ohmic contacts with the regions of doped silicon;
one or more processors; and
memory storing one or more programs for execution by the one or more processors, the one or more programs including instructions for:
  causing the inspection tool to generate a first image of a semiconductor die or portion thereof, comprising causing the image sensor to perform a first instance of TDI along at least a portion of the pairs of pixel columns while illuminating the imaging sensor with light scattered from the semiconductor die or portion thereof and while a first bias is applied to the electrically conductive contacts;
  causing the inspection tool to generate a second image of the semiconductor die or portion thereof, comprising causing the image sensor to perform a second instance of TDI along at least the portion of the pairs of pixel columns while illuminating the imaging sensor with light scattered from the semiconductor die or portion thereof and while a second bias is applied to the electrically conductive contacts; and
  identifying defects in the semiconductor die or portion thereof using the first and second images.

14. The semiconductor-inspection system of claim 13, wherein:
the second bias is a positive bias; and
the first bias is ground.

15. The semiconductor-inspection system of claim 14, wherein the positive bias is less than or equal to six volts.

16. The semiconductor-inspection system of claim 13, wherein the instructions for identifying the defects comprise:
  instructions for combining the first and second images to generate a third image; and
  instructions for comparing the third image to a reference image of the semiconductor die or portion thereof.

17. The semiconductor-inspection system of claim 16, wherein:
the second bias is a positive bias; and
the first bias is ground.

18. The semiconductor-inspection system of claim 13, wherein:
the respective channel stops that separate the pixel columns in the pairs of pixel columns compose a first plurality of channel stops;
the image sensor, in addition to comprising the first plurality of channel stops, further comprises a second plurality of channel stops that separate adjacent pairs of pixel columns;
the second plurality of channel stops comprises respective LOCOS structures, respective regions of doped silicon beneath the respective LOCOS structures, and electrically conductive contacts that extend through the LOCOS structures of the second plurality of channel stops and form ohmic contacts with the regions of doped silicon of the second plurality of channel stops; and
the instructions to cause the inspection tool to generate the first and second images comprise instructions to cause the image sensor to perform the first and second instances of TDI while the electrically conductive contacts of the second plurality of channel stops are grounded.

* * * * *